United States Patent
Oh et al.

(10) Patent No.: US 9,082,483 B2
(45) Date of Patent: Jul. 14, 2015

(54) NONVOLATILE MEMORY DEVICE, METHOD FOR OPERATING THE SAME, AND METHOD FOR FABRICATING THE SAME

(75) Inventors: Seul-Ki Oh, Gyeonggi-do (KR); Jun-Hyuk Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 305 days.

(21) Appl. No.: 13/618,887

(22) Filed: Sep. 14, 2012

(65) Prior Publication Data

US 2013/0215684 A1 Aug. 22, 2013

(30) Foreign Application Priority Data

Feb. 20, 2012 (KR) .................. 10-2012-0016986

(51) Int. Cl.
*G11C 16/04* (2006.01)
*G11C 5/02* (2006.01)
*G11C 5/06* (2006.01)
*H01L 27/115* (2006.01)

(52) U.S. Cl.
CPC .............. *G11C 16/0425* (2013.01); *G11C 5/02* (2013.01); *G11C 5/06* (2013.01); *G11C 16/04* (2013.01); *G11C 16/0483* (2013.01); *H01L 27/11582* (2013.01)

(58) Field of Classification Search
CPC ............ G11C 5/02; G11C 5/06; G11C 16/04; G11C 16/0483; G11C 16/0425; H01L 27/11582
USPC ..................... 365/185.05, 185.17, 51, 63, 72
See application file for complete search history.

(56) References Cited

U.S. PATENT DOCUMENTS

| | | | |
|---|---|---|---|
| 8,107,286 B2* | 1/2012 | Itagaki et al. ............ | 365/185.02 |
| 2010/0133606 A1 | 6/2010 | Jang et al. | |
| 2010/0207195 A1 | 8/2010 | Fukuzumi et al. | |
| 2010/0248439 A1 | 9/2010 | Chung et al. | |
| 2011/0019480 A1* | 1/2011 | Kito et al. ................ | 365/185.18 |
| 2011/0062510 A1 | 3/2011 | Joo | |
| 2011/0076819 A1* | 3/2011 | Kim et al. ..................... | 438/279 |
| 2013/0069152 A1* | 3/2013 | Lee et al. ...................... | 257/335 |
| 2013/0107628 A1* | 5/2013 | Dong et al. .............. | 365/185.17 |
| 2013/0130468 A1* | 5/2013 | Higashitani et al. .......... | 438/382 |

OTHER PUBLICATIONS

Ryota Katsumata et al.,"Pipe-shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Jaehoon Jang et al., "Vertical Cell Array using TCAT (Terabit Cell Array Transistor) Technology for Ultra High Density NAND Flash Memory," 2009 Symposium on VLSI Technology Digest of Technical Papers, pp. 192-193.

* cited by examiner

*Primary Examiner* — J. H. Hur
(74) *Attorney, Agent, or Firm* — IP & T Group LLP

(57) ABSTRACT

A nonvolatile memory device includes a substrate including a plurality of active regions which are constituted by a P-type semiconductor; first and second vertical strings disposed over each active region, wherein each of the first and second strings includes a channel vertically extending from the substrate, a plurality of memory cells, and a select transistor, wherein the plurality of memory cells and the select transistor are located along the channel; and a bottom gate being interposed between a lowermost memory cell and the substrate, contacting the channel with a first gate dielectric layer interposed therebetween, and controlling connection of the first vertical string with the second vertical string.

13 Claims, 23 Drawing Sheets

FIRST DIRECTION ←  → SECOND DIRECTION

NONVOLATILE MEMORY DEVICE, METHOD FOR OPERATING THE SAME, AND METHOD FOR FABRICATING THE SAME

CROSS-REFERENCE TO RELATED APPLICATIONS

The present application claims priority of Korean Patent Application No. 10-2012-0016986, filed on Feb. 20, 2012, which is incorporated herein by reference in its entirety.

BACKGROUND

1. Field

Exemplary embodiments of the present invention relate to a nonvolatile memory device, a method for operating the same and a method for fabricating the same, and more particularly, to a nonvolatile memory device which includes a plurality of memory cells vertically stacked from a substrate, a method for operating the same and a method for fabricating the same.

2. Description of the Related Art

A nonvolatile memory device is a memory device which maintains stored data as they are even when power supply is interrupted. Currently, various nonvolatile memory devices, for example, a NAND type flash memory and the like are widely used.

Recently, as improving the degree of integration of a two-dimensional nonvolatile memory device in which memory cells are formed in a single layer on a silicon substrate reaches a limit, a three-dimensional nonvolatile memory device including a plurality of memory cells vertically stacked from a silicon substrate has been variously suggested in the art.

Referring to the paper entitled "Pipe-shaped BiCS Flash Memory with 16 Stacked Layers and Multi-Level-Cell Operation for Ultra High Density Storage Devices," VLSI Technology, 2009 Symposium, ISBN 978-4-86348-009-4, pp. 136-137, which was disclosed on Jun. 16 to 18, 2009, a flash memory with a PBiCS structure is suggested. In this structure, unlike another conventional three-dimensional nonvolatile memory device including bit lines and source lines respectively disposed over and under stacked memory cells, both bit lines and source lines are located over stacked memory cells. Accordingly, since only one layer of selection gates is needed, advantages are provided in terms of degree of integration, and since the formation of metal source lines is possible, the resistance of the source lines is reduced.

However, because channels are separated from the body of a substrate in the Pipe-shaped BiCS (PBiCS) structure, an erase operation of an F-N tunneling type as in the conventional art, which injects holes into the floating gates of memory cells by applying a high voltage to the body of the substrate, becomes impossible. Instead, data are erased in such a way as to inject holes, which are produced by GIDL (gate induced drain leakage) current flown when a high voltage is applied to selection gates, into channels. Nevertheless, such an erase scheme using GIDL current is difficult to control. An erase operational efficiency deteriorates.

Meanwhile, referring to the paper entitled "Vertical Cell Array using TCAT (Terabit Cell Array Transistor) Technology for Ultra High Density NAND Flash Memory," VLSI Technology, 2009 Symposium, ISBN 978-4-86348-009-4, pp. 192-193, which was disclosed on the same date, a flash memory with a TCAT structure is suggested. In this structure, since channels directly contact the body of a substrate, erase of data as in the conventional art is possible. Furthermore, because word lines are formed through removing sacrificial layers and filling of tungsten in slit structures, advantages are provided in that the resistance of word lines is reduced.

Nonetheless, in the TCAT structure, since source lines are formed in the substrate by performing an ion implantation process through narrow slits, the resistance of source lines may markedly increase.

Consequently, a three-dimensional nonvolatile memory device with a novel structure capable of solving these problems may be demanded in the art.

SUMMARY

Embodiments of the present invention are directed to a nonvolatile memory device including vertically stacking memory cells, which can easily and efficiently perform an erase operation, reduce the resistance of a source line and increase the degree of integration, and a method for fabricating the same.

In accordance with an embodiment of the present invention, a nonvolatile memory device includes a substrate including a plurality of active regions which are constituted by a P-type semiconductor; first and second vertical strings disposed over each active region, wherein each of the first and second strings includes a channel vertically extending from the substrate, a plurality of memory cells, and a select transistor, wherein the plurality of memory cells and the select transistor are located along the channel; and a bottom gate being interposed between a lowermost memory cell and the substrate, contacting the channel with a first gate dielectric layer interposed therebetween, and controlling connection of the first vertical string with the second vertical string.

In accordance with another embodiment of the present invention, a nonvolatile memory device includes a substrate including a plurality of active regions which are constituted by a P-type semiconductor; and first and second vertical strings disposed over each active region, wherein each of the first and second strings includes a channel vertically extending from the substrate, a plurality of memory cells, and a select transistor, wherein the plurality of memory cells and the select transistor are located along the channel; and wherein a word line of a lowermost memory cell among the plurality of memory cells controls connection of the first vertical string with the second vertical string.

In accordance with another embodiment of the present invention, a nonvolatile memory device includes a substrate including a plurality of active regions which are constituted by a P-type semiconductor; first and second vertical strings disposed over each active region, wherein each of the first and second strings includes a channel vertically extending from the substrate, a plurality of memory cells, and a select transistor, wherein the plurality of memory cells and the select transistor are located along the channel; and an N-type impurity region formed in the active region to be disposed between the channel of the first vertical string and the channel of the second vertical string, and connecting the first vertical string with the second vertical string.

In accordance with another embodiment of the present invention, a method for operating the nonvolatile memory device includes applying a pass voltage to a bottom gate in a read operation or a program operation to form an inverted region in an active region, thereby connecting a first vertical string and a second vertical string with each other; and applying an erase voltage to the active region in an erase operation.

In accordance with another embodiment of the present invention, a method for operating the nonvolatile memory device includes applying a pass voltage to a word line of the lowermost memory cell in a read operation or a program operation to form an inverted region in an active region, thereby connecting the first vertical string and the second vertical string with each other; and applying an erase voltage to the active region in an erase operation.

In accordance with another embodiment of the present invention, a method for operating the nonvolatile memory device includes applying an erase voltage to the active region in an erase operation.

In accordance with still another embodiment of the present invention, a method for fabricating a nonvolatile memory device includes forming trenches defining a plurality of active regions, by selectively etching a P-type semiconductor layer or a P-type semiconductor substrate; forming an isolation layer which is filled in the trenches; and forming first and second vertical strings which are disposed over each active region, wherein each of the first and second strings includes a channel vertically extending from the substrate, a plurality of memory cells, and a select transistor, wherein the plurality of memory cells and the select transistor are located along the channel.

DETAILED DESCRIPTION

Figure 1:
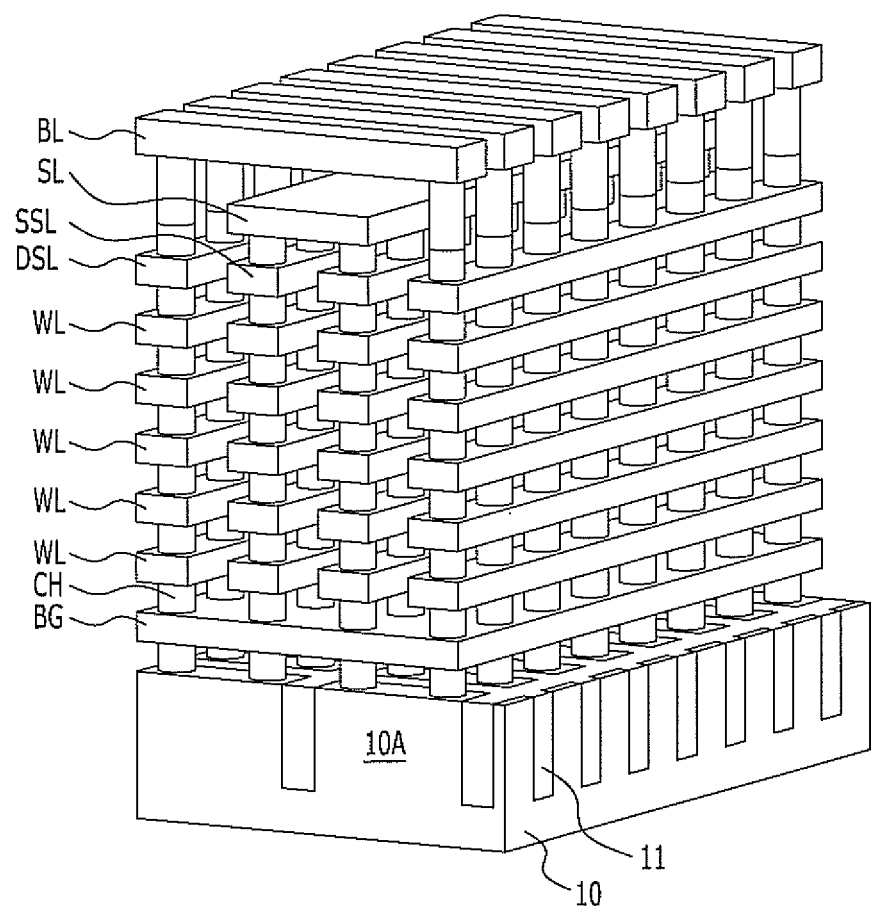
FIGS. 1 and 2 are respectively a perspective view and a circuit diagram showing a nonvolatile memory device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hereafter, a nonvolatile memory device in accordance with a first embodiment of the present invention, a method for operating the same and a method for fabricating the same will be described with reference to FIGS. 1 to 13.

Figure 2:
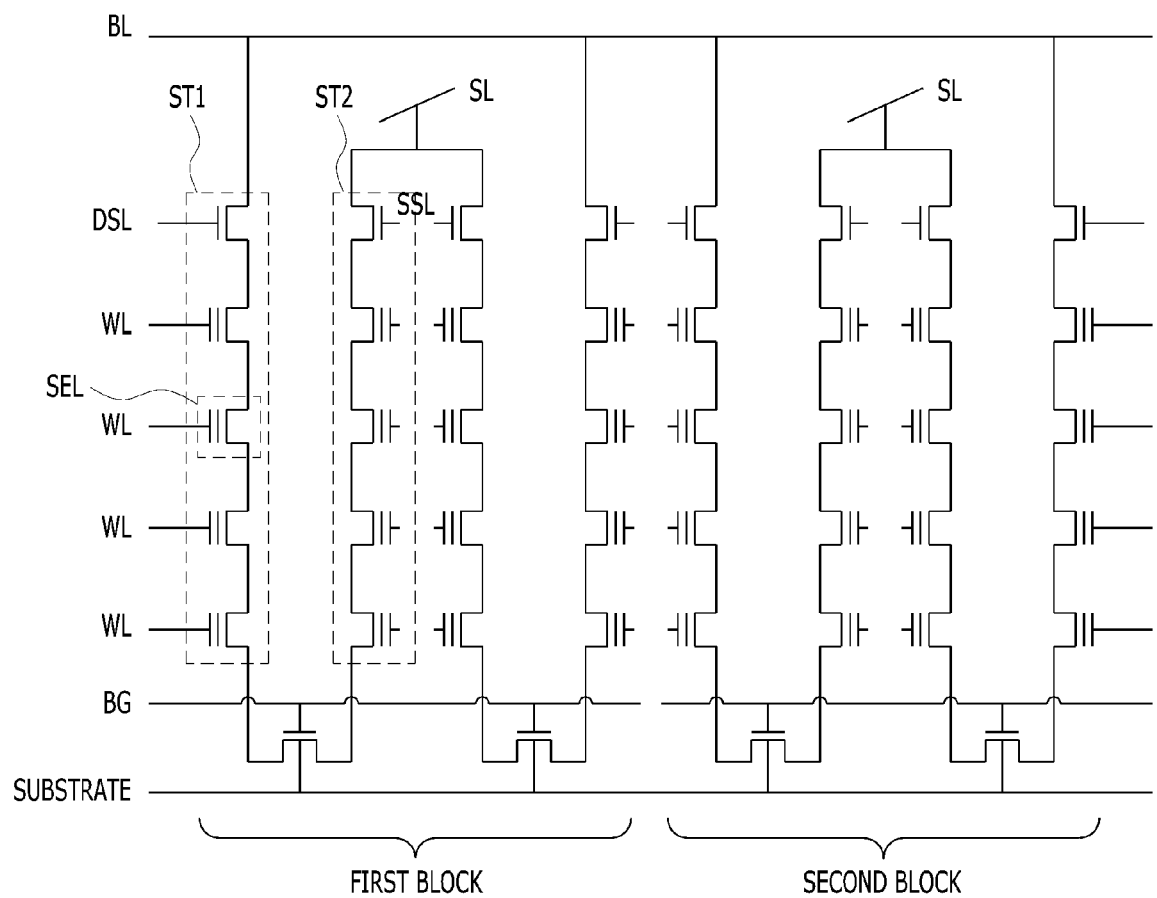

FIGS. 1 and 2 are respectively a perspective view and a circuit diagram showing a nonvolatile memory device in accordance with a first embodiment of the present invention. While only one block is shown in FIG. 1 and two blocks adjacent in a first direction are shown in FIG. 2 for the sake of convenience in explanation, it is to be noted that a nonvolatile memory device includes a plurality of blocks which are arranged in the first direction and a second direction.

Referring to FIGS. 1 and 2, the nonvolatile memory device according to the present embodiment includes a substrate 10, a pair of vertical strings ST1 and ST2, and a bottom gate BG. The substrate 10 may include a P-type semiconductor. A plurality of active regions 10A is defined in the substrate 10 by an isolation layer 11. The pair of vertical strings ST1 and ST2 is formed on each active region 10A. The bottom gate BG controls connection of vertical strings ST1 and ST2 in such a way as to form an inverted region in the active region 10A.

In detail, the plurality of active regions 10A formed in the substrate 10 is arranged in the form of a matrix along a first direction and a second direction which is different from the first direction. Each active region 10A has the shape of a bar which has the major axis extending in the first direction and the minor axis extending in the second direction, when viewed from the top. The respective active regions 10A are separated from one another by the isolation layer 11 which is formed to a predetermined depth. Since the substrate 10 is constituted by a P-type semiconductor, the active regions 10A are also constituted by the P-type semiconductor.

The pair of vertical strings ST1 and ST2 is located at each active region 10A. For the sake of convenience in explanation, between vertical strings ST1 and ST2. The vertical string to be connected with a bit line BL will be referred to as a first vertical string ST1. The vertical string to be connected with a source line SL will be referred to as a second vertical string ST2. The first vertical string ST1 includes a channel CH, a memory layer (not shown), and a gate dielectric layer (not shown). A lower end of the channel CH directly contacts the active region 10A. A plurality of word lines WLs surrounds the channel CH with a regular gap. A drain select line DSL formed over the plurality of word lines WLs surrounds an upper portion of the channel CH. The memory layer is interposed between each word line WL and the channel CH. The gate dielectric layer is interposed between the drain select line DSL and the channel CH. The second vertical string ST2 includes a channel CH, a memory layer (not shown), and a gate dielectric layer (not shown). A lower end of the channel CH directly contacts the active region 10A. A plurality of word lines WLs surrounds the channel CH with a regular gap. A source select line SSL formed over the plurality of word lines WLs surrounds an upper portion of the channel CH. The memory layer is interposed between each word line WL and the channel CH. The gate dielectric layer is interposed between the source select line SSL and the channel CH.

The memory layer insulates the channel CH and the word lines WL from each other, and performs the function of storing charges. The memory layer includes a tunnel dielectric layer which is disposed adjacent to the channel CH and allows tunneling of charges, a charge blocking layer which is disposed adjacent to the word lines WL and blocks movement of charges, and a charge storage layer which is interposed between the tunnel dielectric layer and the charge blocking layer and performs the function of storing charges. For example, each of the tunnel dielectric layer and the charge blocking layer may be an oxide layer, and the charge storage layer may be a nitride layer with a charge trap function.

Interlayer dielectric layers (not shown) are interposed between the word lines WL, between the word line WL and the drain select line DSL, and between the word line WL and the source select line SSL, in order to insulate them from each other. The memory layer and the word line WL, which contact the channel CH, constitute a unit memory cell. The gate dielectric layer and the drain select line DSL, which contact the channel CH, constitute a drain select transistor. The gate dielectric layer and the source select line SSL, which contact the channel CH, constitute a source select transistor. The word lines WL, the drain select line DSL and the source select line SSL respectively have the shape of lines extending in the second direction, and respectively contact plural channels CH, which are like vertical poles arranged in the second direction over the substrate 10.

The bit line BL like a line extending in the first direction is connected through a bit line contact BLC with the upper end of the channel CH of the first vertical string ST1. The source line SL like a line extending in the second direction is connected with the upper end of the channel CH of the second vertical string ST2. The drain select transistor controls the connection of the bit line BL and the first vertical string ST1. The source select transistor controls the connection of the source line SL and the second vertical string ST2.

The bottom gate BG is located between the lowermost word line WL and the substrate 10. The bottom gate BG has a plate-like shape which is penetrated by the plural channels CH. The bottom gate BG is separated from another bottom gate BG formed in another block area of the nonvolatile memory device. The gate dielectric layer is located between the bottom gate BG and the channels CH. The interlayer dielectric layer is interposed between the lowermost word line WL and the bottom gate BG to insulate them from each other. The gate dielectric layer is interposed between the bottom gate BG and the substrate 10. The gate dielectric layer may have a thickness required to form an inverted region which changes the electric characteristic from P-type to N-type, or from N-type to P-type.

The bottom gate BG may form the inverted region in the active region 10A according to an applied voltage. The inverted region may connect the first vertical string ST1 and the second vertical string ST2 with each other. In detail, in the case where a predetermined positive voltage such as a pass voltage is applied to the bottom gate BG, an N-type inverted region is formed in the active region 10A which is constituted by the P-type semiconductor. Accordingly, a current pass, which connects the channel CH of the first vertical string ST1 and the channel CH of the second vertical string ST2 with each other, may be produced in the active region 10A. In other words, a kind of pass transistor for controlling the connection of the first vertical string ST1 and the second vertical string ST2 is formed between the first vertical string ST1 and the second vertical string ST2. The gate terminal, the drain terminal, the source terminal and the substrate terminal of the pass transistor are respectively connected to the bottom gate BG, the channel CH of the first vertical string ST1, the channel CH of the second vertical string ST2 and the substrate 10.

If the first vertical string ST1 and the second vertical string ST2 are connected with each other, one U-shaped string including the drain select transistor, the plurality of memory cells and the source select transistor electrically connected in series. One U-shaped string is located on each active region 10A.

While the present embodiment illustrates the case in which one block includes two U-shaped strings in the first direction, it is to be noted that the present invention is not limited to such and the number of U-shaped strings included in one block may be changed in a variety of ways. Also, while FIG. 2 shows two blocks which are arranged side by side in the first direction, it is to be noted that the present invention is not limited to such and a plurality of blocks may be arranged in the first direction and/or the second direction.

The second vertical string ST2 of one U-shaped string and the second vertical string ST2 of another U-shaped string adjacent to the one U-shaped string in the first direction are disposed adjacent to each other; and, accordingly, those may be commonly connected to the same source line SL. Furthermore, the first vertical strings ST1s, which are arranged adjacent to each other in the first direction, may be connected to one bit line BL.

By the nonvolatile memory device in accordance with the first embodiment of the present invention configured as mentioned above, the following effects may be achieved.

First, since the bit line BL and the source line SL are disposed over the first and second vertical strings ST1 and ST2, the bit line BL and the source line SL may be implemented by a low resistance substance such as a metal. Moreover, since the drain select transistor and the source select transistor are formed on the same layer, the degree of integration in the vertical direction is improved.

In addition, the channels CH of the first and second vertical strings ST1 and ST2 are directly connected with the active region 10A of the substrate 10 which is constituted by the P-type semiconductor. Therefore, because an erase operation may be performed in such a way as to inject holes into the channels CH by applying a high positive voltage to the substrate 10, excellent erase efficiency may be achieved.

In this way, even though the channels CH of the first and second vertical strings ST1 and ST2 are directly connected with the active region 10A, the operation of the nonvolatile memory device has no adversely influence because the first vertical string ST1 and the second vertical string ST2 may be connected with each other by forming the inverted region using the bottom gate BG as the occasion demands, for example, in a read operation or a program operation.

In brief, the nonvolatile memory device in accordance with the first embodiment of the present invention may take the advantageous effects of the conventional PBiCS structure and TCAT structure, though operating in a way of controlling the voltage applied to the bottom gate BG like the conventional art.

A detailed operating method will be described below with reference to FIG. 2 for which explanations are made above and Table 1 which is given below.

TABLE 1

| Block | READ | | PROGRAM | | ERASE | |
|---|---|---|---|---|---|---|
| | sel. | unsel. | sel. | unsel. | sel. | unsel. |
| sel. BL | 1 V | | 0 V | | floating | |
| unsel. BL | 0 V | | Vcc | | floating | |
| SL | 0 V | | Vcc | | floating | |

TABLE 1-continued

| Block | READ sel. | READ unsel. | PROGRAM sel. | PROGRAM unsel. | ERASE sel. | ERASE unsel. |
|---|---|---|---|---|---|---|
| sel. DSL | Vcc | | Vcc | | floating | |
| unsel. DSL | 0 V | | 0 V | | floating | |
| sel. SSL | Vcc | | 0 V | | floating | |
| unsel. SSL | 0 V | | | | | |
| sel. WL | Vread | | Vpgm | | 0 V | floating |
| unsel. WL | Vread-pass1 | | Vpass1 | | | |
| BG | Vread-pass2 | 0 V | Vpass2 | 0 V | floating | |
| substrate | 0 V or floating | | 0 V or floating | | Verase | |

First, a read operation will be described. For the sake of convenience in explanation, it is assumed that the memory cell denoted by the reference character SEL in FIG. 2 is a selected memory cell which is to be read. Further, it is assumed that the U-shaped string, the left U-shaped string in FIG. 2, including the selected memory cell is a selected string. Furthermore, the drain select line and the source select line of the selected string will be referred to as a selected drain select line, sel. DSL, and a selected source select line, sel. SSL. The bottom gate of a block, the first block in FIG. 2, which includes the selected string will be referred to as a selected bottom gate, sel. BG.

A predetermined voltage, for example, 1V, is applied to the selected bit line, sel. BL, to precharge the selected bit line, sel. BL. A voltage 0V is applied to remaining unselected bit lines, unsel. BL, which is not shown in FIG. 2, and the source line SL.

Then, a voltage for completely turning on the drain select transistor and the source select transistor, for example, a power supply voltage Vcc, is applied to the selected drain select line, sel. DSL, and the selected source select line, sel. SSL, such that the selected string and the bit line BL and the source line SL are connected with one another. A turn-off voltage, for example, 0V, is applied to remaining unselected drain select lines, unsel. DSL, and remaining unselected source select lines, unsel. SSL, such that the remaining unselected drain select lines, unsel. DSL, and the remaining unselected source select lines, unsel. SSL, are not connected with the bit line BL and the source line SL.

Next, a read voltage Vread, for example, 0V, is applied to the selected word line, sel. WL. A pass voltage Vread-pass1, for example, 4 to 5V, is applied to remaining unselected word lines, unsel. WL. Furthermore, in order to ensure that the first and second vertical strings ST1 and ST2 of the selected string are connected with each other and the selected string forms a substantially U-shaped string, a kind of pass voltage Vread-pass2 is applied to the selected bottom gate, sel. BG. A turn-off voltage, for example, 0V, is applied to the unselected bottom gate, unsel. BG, of the remaining block (for example, the second block in FIG. 2). The pass voltage Vread-pass2 has a value capable of forming the inverted region in the substrate 10. The same voltage level as the pass voltage Vread-pass1 applied to the unselected word lines, unsel. WL, may be used. In such a read operation, the substrate 10 may be applied with 0V or may be in a floated state.

By applying voltages in the way as described above, current flow is produced in the selected string. By sensing whether the voltage of the selected bit line, sel. BL, is changed, the data stored in the selected memory cell is read out.

Next, a program operation will be described. For the sake of convenience in explanation, it is assumed that the memory cell denoted by the reference character SEL in FIG. 2 is a selected memory cell which is to be programmed. Accordingly, a selected string, a selected bit line, sel. BL, a selected drain select line, sel. DSL, a selected source select line, sel. SSL, and a selected bottom gate, sel. BG, are defined in the same manner as in the read operation.

A bit line program voltage, for example, 0V, is applied to the selected bit line, sel. BL. A bit line program inhibition voltage, for example, the power supply voltage Vcc, is applied to unselected bit lines, unsel. BL, which is not shown in FIG. 2.

Then, a voltage for completely turning on the drain select transistor, for example, the power supply voltage Vcc, is applied to the selected drain select line, sel. DSL, such that the selected string and the bit line BL are connected with each other. A turn-off voltage, for example, 0V, is applied to the unselected drain select line, unsel. DSL, such that connecting the unselected drain select line, unsel. DSL, with the bit line BL is blocked. A turn-off voltage, for example, 0V, is applied to all source select lines SSL such that connection of the source select lines SSL with source lines SL, which is applied with, e.g., the power supply voltage Vcc, is blocked. That is to say, the selected string is connected only with the selected bit line sel. BL which is applied with 0V.

Thereupon, a program voltage Vpgm, for example, 18 to 20V, is applied to the selected word line, sel. WL. A pass voltage Vpass1, for example, about 10V, is applied to remaining unselected word lines, unsel. WL. Furthermore, in order to ensure that the first and second vertical strings ST1 and ST2 of the selected string are connected with each other and the selected string forms a substantially U-shaped string, a kind of pass voltage Vpass2 is applied to the selected bottom gate, sel. BG. A turn-off voltage, for example, 0V, is applied to the unselected bottom gate, unsel. BG, of the remaining block (for example, the second block in FIG. 2). The pass voltage Vpass2 has a value capable of forming the inverted region in the substrate 10. The same value as the pass voltage Vpass1 applied to the unselected word lines, unsel. WL, may be used. In such a program operation, the substrate 10 may be applied with 0V, or may be in a floated state.

By applying voltages in the way as described above, electrons may be injected into the charge storage layer of the selected memory cell connected to the selected word line, sel. WL. A program operation for storing data in the selected memory cell may be performed.

In succession, an erase operation will be described. The erase operation may be performed by the unit of a block. For the sake of convenience in explanation, it is assumed that the data stored in all memory cells of the first block in FIG. 2 are erased.

By applying 0V to the word lines WL of the first block as an erase object and applying an erase voltage Verase, for example, a high positive voltage of 18 to 20V, to the substrate 10, holes are injected into the channels and data are erased. At this time, the bit lines BL, the source line SL, the drain select lines DSL, the source select lines SSL and the bottom gate BG are all in floated states.

Conversely, the voltage applying condition for the second block not as an erase object is different from the voltage applying condition for the first block only in that word lines WL of the second block are in a floated state. In the case where the word lines WL of the second block are in a floated state, when the erase voltage Verase is applied to the substrate 10, as a potential is boosted, the data of the memory cells of the second block are prevented from being erased.

Hereafter, an embodiment of a method for fabricating the device shown in FIGS. 1 and 2 will be described with reference to FIGS. 3A to 10. Cross-sectional views are basically shown, and plan views are shown as the occasion demands. In the case where a cross-sectional view and a plan view are shown together, the cross-sectional view has a suffix A and the corresponding plan view has a suffix B. Also, the exemplary case includes two blocks, each including four U-shaped strings arranged in the form of a 2*2 matrix. In particular, in these drawings, the peripheral regions of the blocks which are not shown in FIGS. 1 and 2 are shown.

Figure 3A:
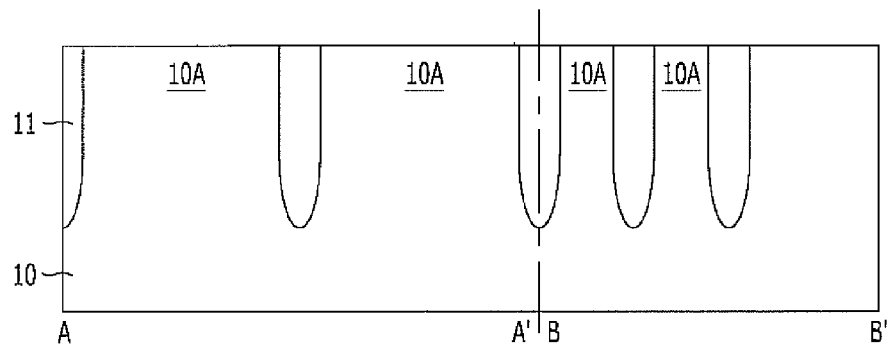
FIGS. 3A to 10 are views explaining an embodiment of a method for fabricating the device shown in FIGS. 1 and 2.
Figure 3B:
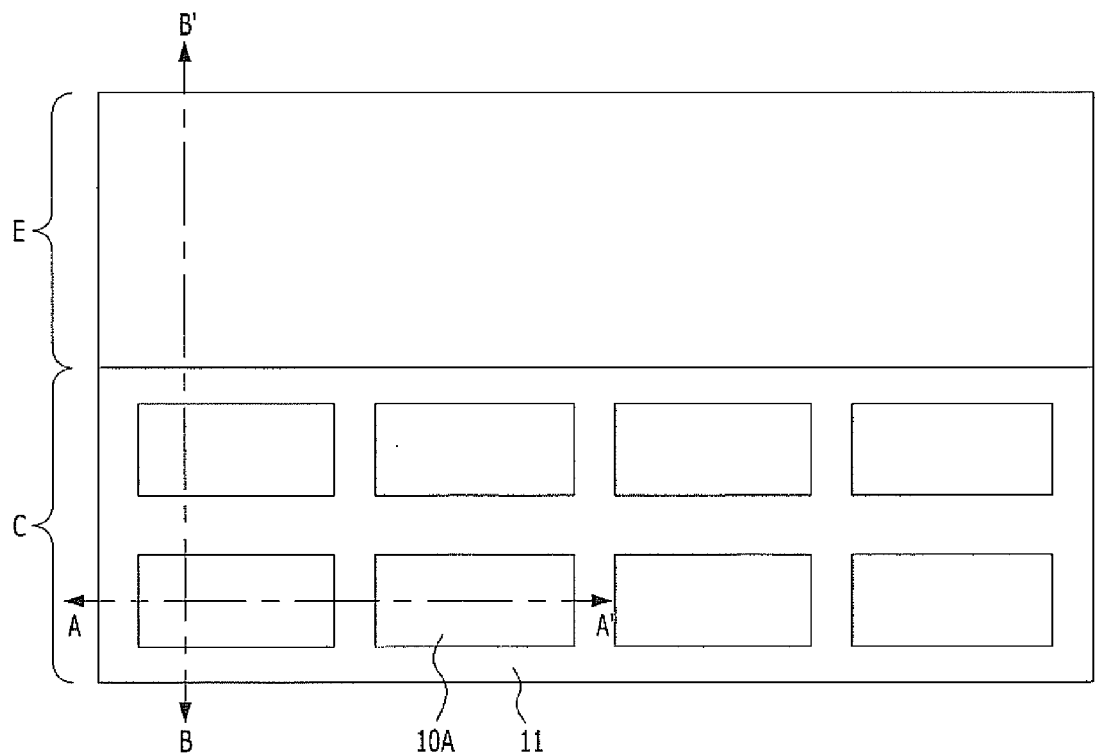

Referring to FIGS. 3A and 3B, a substrate 10 constituted by a P-type semiconductor is provided. The substrate 10 is defined with a central region C, including memory cells, and a remaining peripheral region E. While it is illustrated in these drawings that the peripheral region E is defined only on the upper side of the central region C, it is to be noted that the same peripheral region may be defined also on the lower side of the central region C.

Then, after defining a trench for an isolation purpose by selectively etching the isolation area of the center region C of the substrate 10, an isolation layer 11 is formed by filling an insulation layer, such as an oxide layer or a nitride layer, in the trench for an isolation purpose. Active regions 10A are defined in the substrate 10 by the isolation layer 11.

In the present embodiment, since two blocks are arranged and four strings are arranged for each block, total eight (4*2) active regions WA are defined. It is to be appreciated that the number of active regions 10A may be changed variously in consideration of the number of blocks and the number of strings.

Figure 4A:
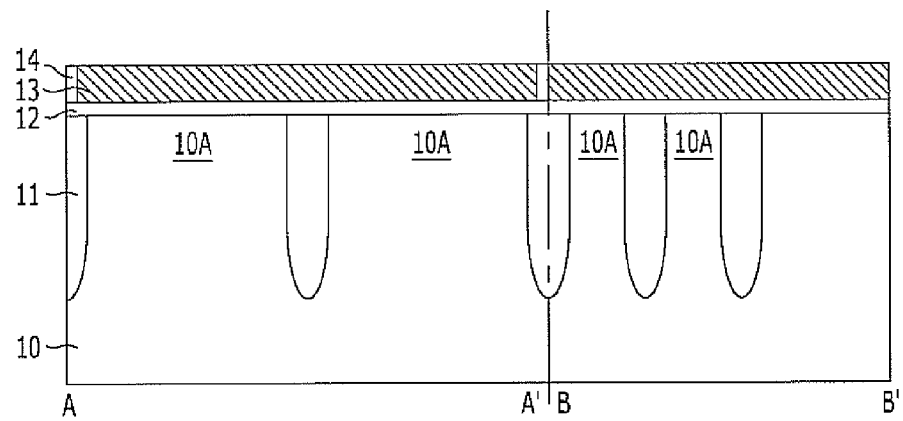
Figure 4B:
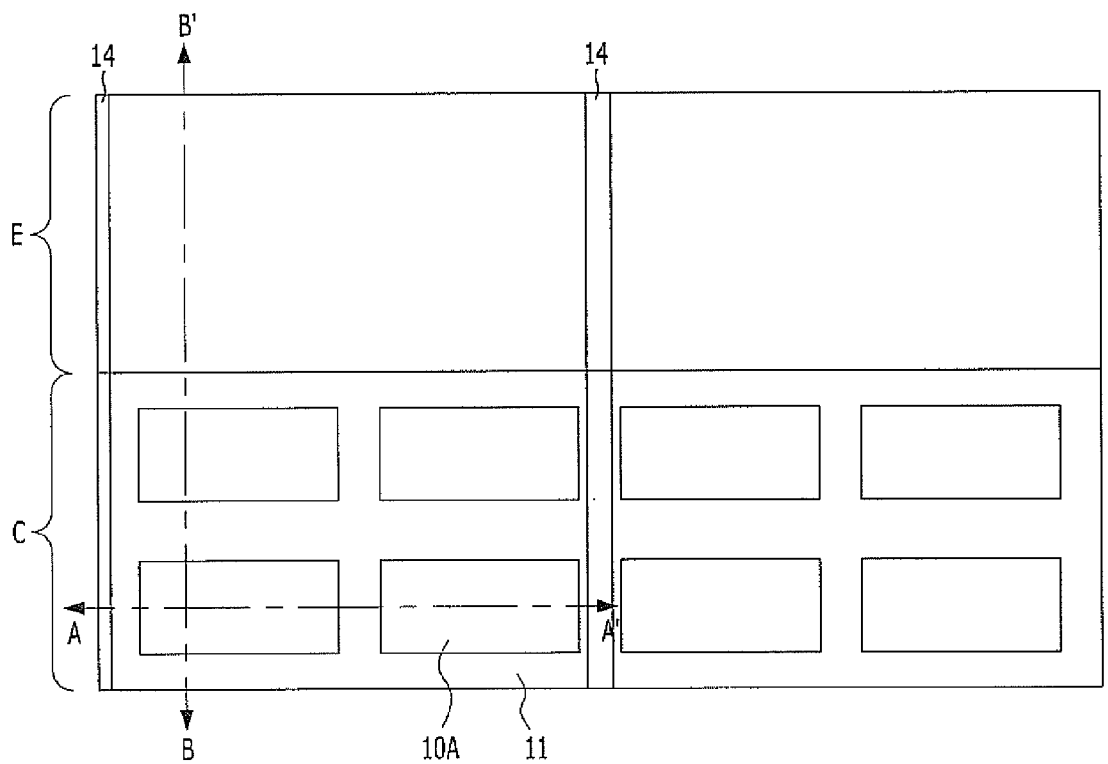

Referring to FIGS. 4A and 4B, a first gate dielectric layer 12 is formed on the substrate 10 including the isolation layer 11. The first gate dielectric layer 12 may be an oxide layer or a nitride layer, and may have a thickness capable of allowing formation of inverted regions in the active regions 10A.

Next, after depositing a conductive layer for bottom gates on the first gate dielectric layer 12, bottom gates 13 are formed by etching the conductive layer for bottom gates such that it is separated for respective blocks. As a consequence, each bottom gate 13 has a plate-like shape which covers the central region C and the peripheral region E where one block is disposed. Such bottom gates 13 may be formed of polysilicon doped with impurities or a metal.

In succession, a first dielectric layer 14 is filled in spaces between the bottom gates 13. The first dielectric layer 14 functions to separate the bottom gates 13 for respective blocks from one another, and may be, for example, an oxide layer.

Figure 5:
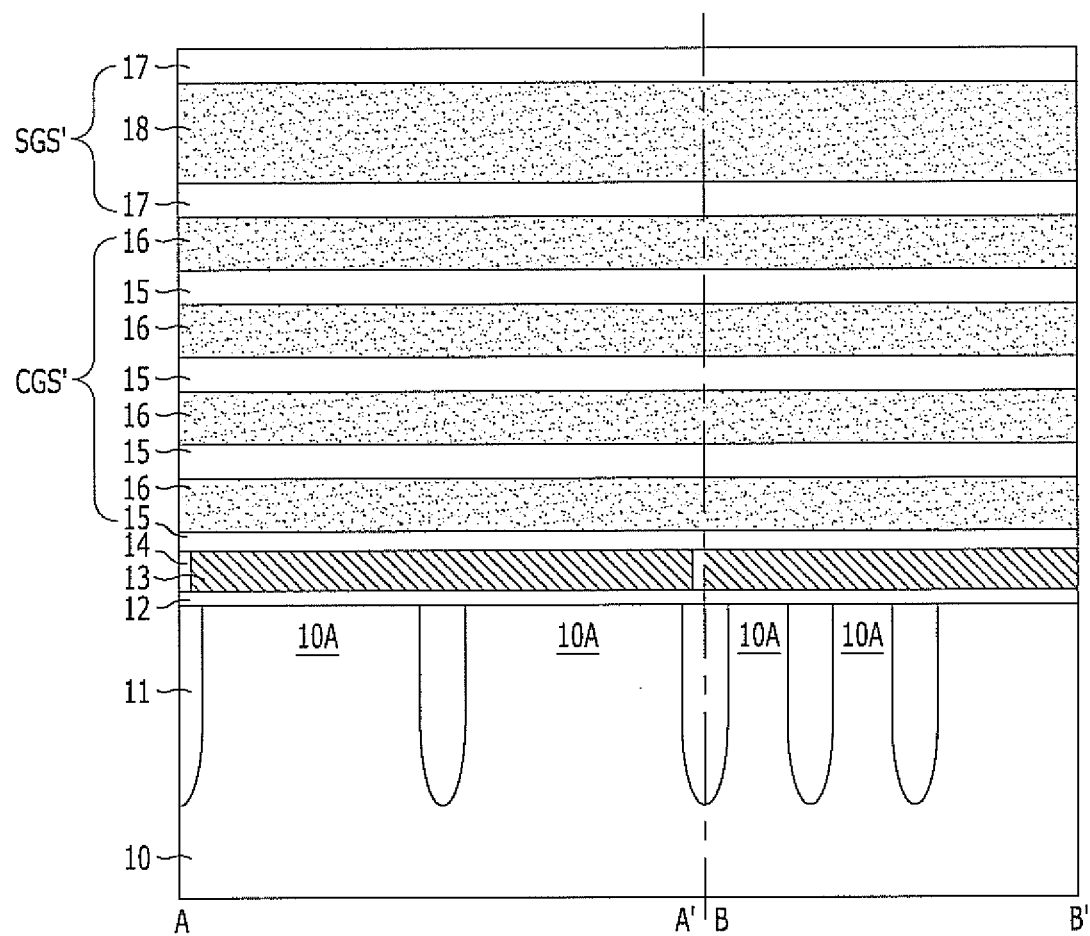

Referring to FIG. 5, a plurality of first interlayer dielectric layers 15 and a plurality of first sacrificial layers 16 are alternately stacked on the bottom gates 13 and the first dielectric layer 14. The first sacrificial layers 16 are removed in a subsequent process, provide spaces for forming word lines, and may include, for example, nitride layers. The first interlayer dielectric layers 15 are for separating multiple layers of word lines from one another, and may include layers with an etching selectivity with respect to the first sacrificial layers 16, for example, oxide layers. Hereinbelow, for the sake of convenience in explanation, the alternate stack structure of the first interlayer dielectric layers 15 and the first sacrificial layers 16 will be referred to as an initial cell gate structure CGS'.

Thereafter, a second interlayer dielectric layer 17, a second sacrificial layer 18 and another second interlayer dielectric layer 17 are sequentially stacked on the initial cell gate structure CGS'. The second sacrificial layer 18 is removed in a subsequent process, provides spaces for forming a drain select line and a source select line, and may include, for example, a nitride layer. The second interlayer dielectric layers 17 are for separating the drain select line and the source select line from upper and lower parts, and may include, for example, oxide layers. Hereinbelow, for the sake of convenience in explanation, the sequential stack structure of the second interlayer dielectric layer 17, the second sacrificial layer 18 and the second interlayer dielectric layer 17 will be referred to as an initial select gate structure SGS'.

Figure 6:
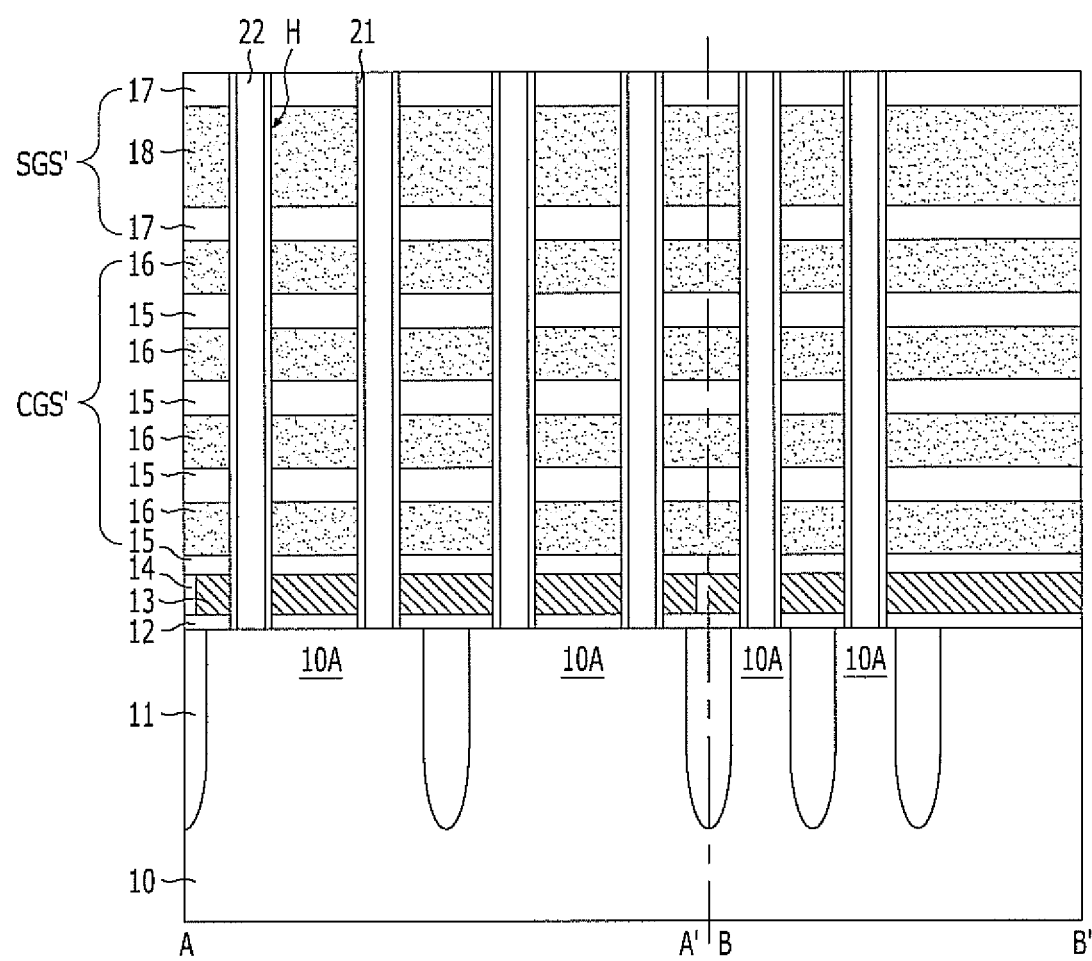

Referring to FIG. 6, channel holes H are defined through the initial cell gate structure CGS', the initial select gate structure SGS', the bottom gate 13 and the first gate dielectric layer 12 in such a way as to expose the active regions 10A. A pair of channel holes H is defined for each active region 10A. The pair of channel holes H is arranged side by side in the first direction as the major axis direction of the active region 10A.

Then, after forming a second dielectric layer 21 on the sidewalls of the channel holes H, channels 22 are formed in such a way as to be filled in the channel holes H. The second dielectric layer 21 serves as a gate dielectric layer between the bottom gate 13 and the channels 22, and may include, for example, a high dielectric constant oxide layer such as an alumina layer or a silicon oxide layer. Otherwise, the second dielectric layer 21 may include a memory layer constituted by an oxide layer, a nitride layer and an oxide layer. While the second dielectric layer 21 is formed on the entire sidewalls of the channel holes H, it is to be noted that the present invention is not limited to such. In another embodiment, the second dielectric layer 21 may be formed only on the sidewalls of the bottom gate 13 which are exposed in the channel holes H, by thermally oxidating the sidewalls of the bottom gate 13. The channels 22 may be formed of a substance, for example, amorphous silicon, monocrystalline silicon, or polysilicon. While, in the present embodiment, the channels 22 have shapes which completely fill the channel holes H, it is to be noted that the present invention is not limited to such. In another embodiment, the channels 22 may have a thickness that partially fills the channel holes H, and in this case, spaces left after the channels 22 are filled may be filled with a dielectric substance such as PSZ.

Figure 7:
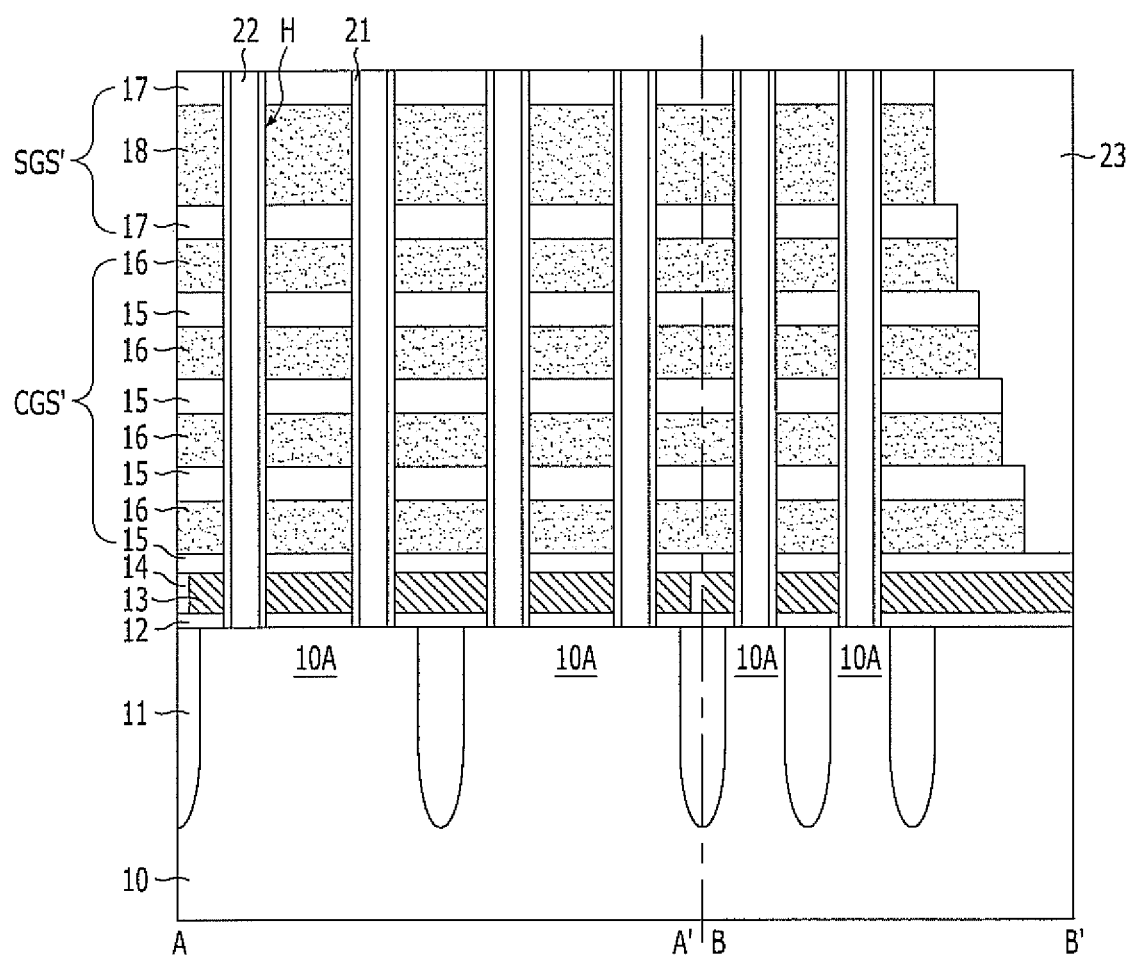

Referring to FIG. 7, by etching the initial cell gate structure CGS' and the initial select gate structure SGS' of the peripheral region E of the substrate 10, step-like shapes are formed. Etching of the stack structures is performed using an etching process referred to as slimming. Since this procedure is generally known in the art, detailed description thereof will be omitted herein.

As a result of the process, in the peripheral region E of the substrate 10, each first sacrificial layer 16 has an end which projects beyond the corresponding end of the first sacrificial layer 16 or the second sacrificial layer 18 placed over each first sacrificial layer 16. This is for a subsequent contact forming process (see FIG. 10).

Next, a third interlayer dielectric layer 23 is formed to fill the etched spaces. The third interlayer dielectric layer 23 may include, for example, an oxide layer.

Figure 8A:
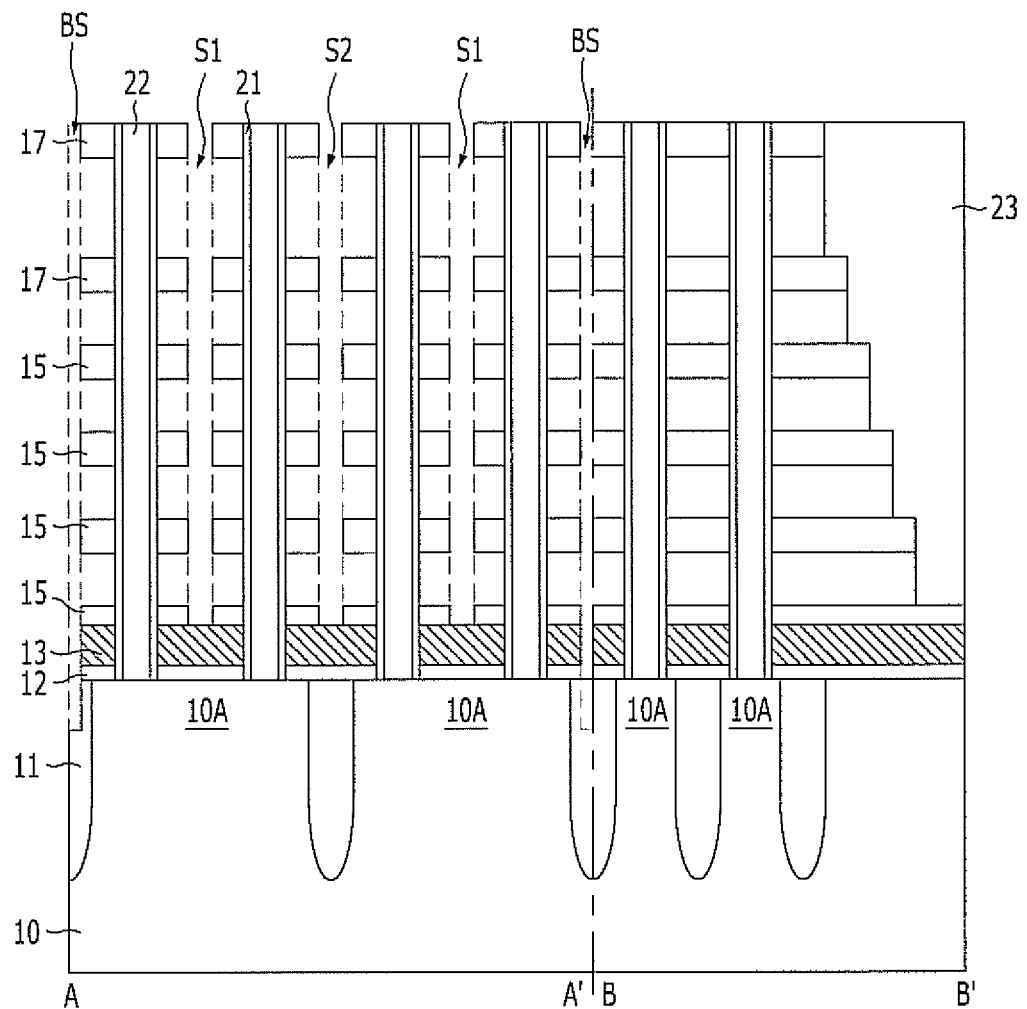
Figure 8B:
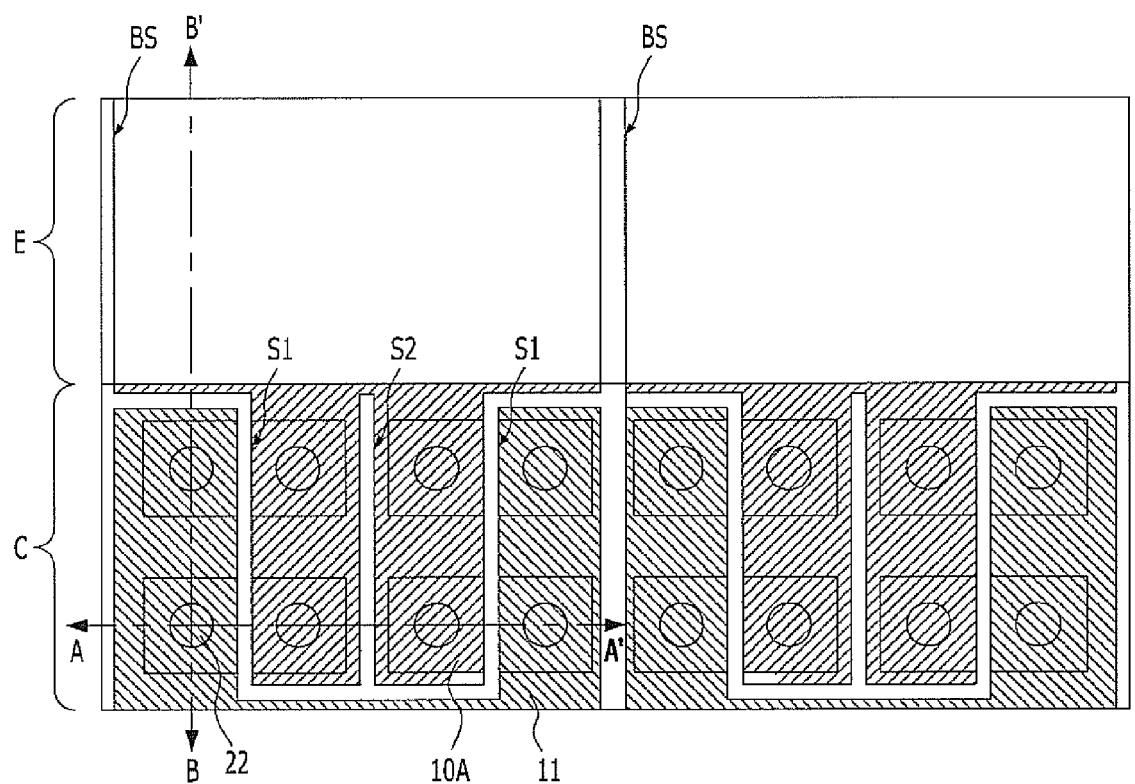

Referring to FIGS. 5A and 8B, by selectively etching the initial cell gate structure CGS' and the initial select gate structure SGS', first and second slits S1 and S1 and block slits BS are defined to pass through the initial cell gate structure CGS' and the initial select gate structure SGS'.

Each first slit S1 between the pair of channels 22 formed for each active region 10A extends in the second direction. Each second slit S2 between channels 22 which belong to different pairs and are adjacent to each other extends in the second direction. However, the first and second slits S1 and 52 are defined to have a length that does not extend completely across the central region C, and have ends which appropriately communicate with slits extending in the first direction.

By the combination of the first and second slits S1 and S2 and the slits extending in the first direction, portions of a subsequently formed final cell gate structure CGS are connected with a subsequently formed final select gate structure SGS which are to be connected with a source line (see left downward hatching). Portions of the subsequently formed final cell gate structure CGS are connected with the subsequently formed final select gate structure SGS which are to be connected with a bit line (see right downward hatching). While the bottom gate 13 is exposed through the first and second slits S1 and S2, it is to be noted that the present invention is not limited to such. It is sufficient that the first and second slits S1 and S2 are defined to a depth that pass through the lowermost first sacrificial layer 16.

The block slits BS are defined at positions which overlap with the first dielectric layer 14. The block slits BS are defined to separate the final cell gate structure CGS and the final select gate structure SGS for respective blocks. Accordingly, the block slits BS extend across the central region C and the peripheral region E in the second direction. Since the bottom gate 13 does not present under the block slits BS, the etching depth of the block slits BS may be larger than that of the first and second slits S1 and S2.

In succession, the first and second sacrificial layers 16 and 18 which are exposed through the first and second slits S1 and S2 and the block slits BS are removed. The first and second sacrificial layers 16 and 18 may be removed through wet etching.

Figure 9:
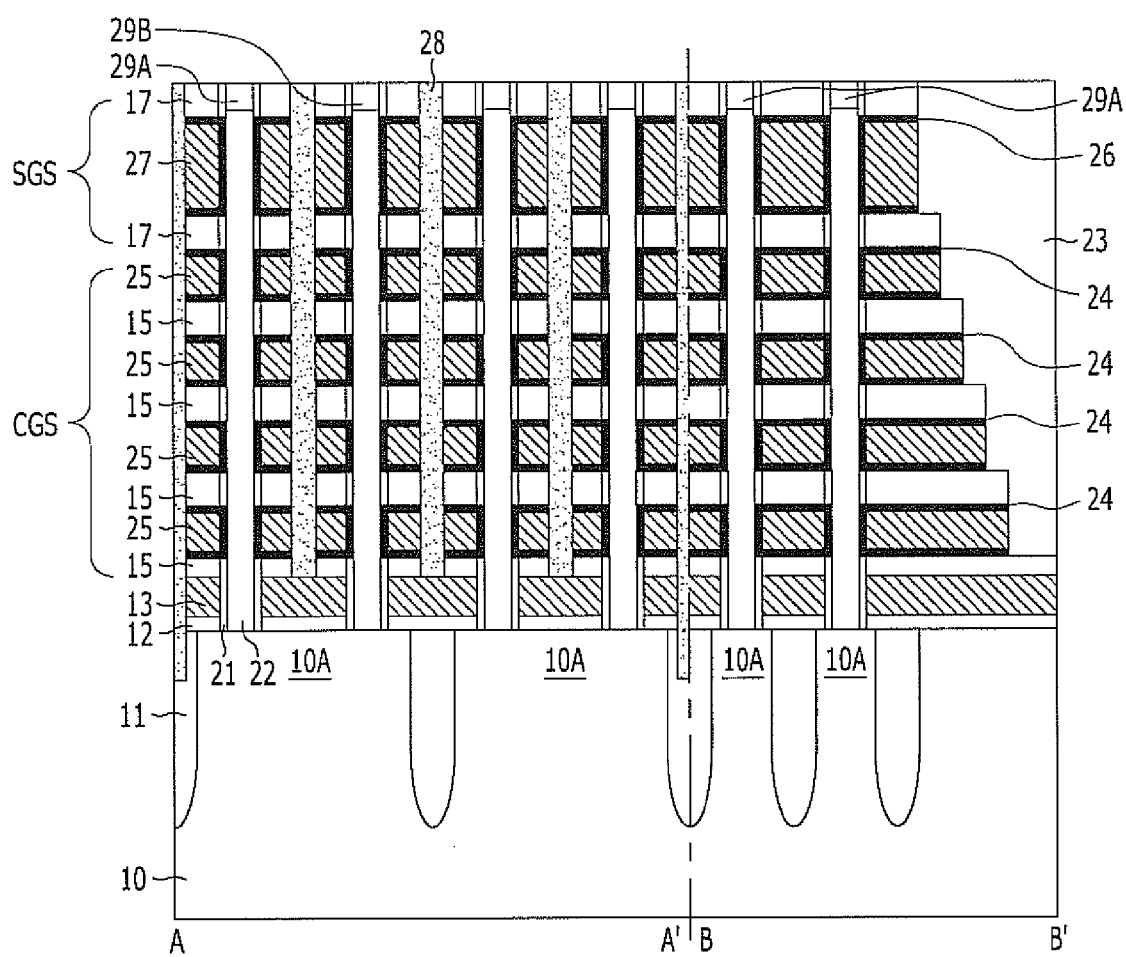

Referring to FIG. 9, after removing portions of the second dielectric layer 21 which are exposed by the removal of the first and second sacrificial layers 16 and 18, a memory layer is formed on the entire surface of the resultant structure. A conductive layer is formed to a thickness capable of filling the remaining spaces. Thereafter, by performing blanket etching, and etc., the memory layer and the conductive layer remain only in the spaces from which the first and second sacrificial layers 16 and 18 are removed. The memory layer may be formed by sequentially depositing a tunnel dielectric layer, a charge storage layer and a charge blocking layer, for example, an oxide layer, a nitride layer and an oxide layer. The conductive layer may include a metallic substance such as a tungsten or a polysilicon doped with impurities.

As a result of this process, a first memory layer 24 and word lines 25 are formed in the spaces from which the first sacrificial layers 16 are removed. A second memory layer 26 and select lines 27 are formed in the spaces from which the second sacrificial layer 18 is removed. The first memory layer 24, interposed between the channels 22 and the word lines 25, performs functions of insulating them from each other and storing charges. Conversely, the second memory layer 26, interposed between the channels 22 and the select lines 27 due to the characteristics of the process of the present embodiment, serves as a gate dielectric layer. In the case where a process change is made in another embodiment, a single dielectric layer instead of the second memory layer 26 may be interposed between the channels 22 and the select lines 27. If the select line 27 which contacts one channel of a pair of channels 22 constitutes a drain select line, the select line which contacts the other channel of the pair of channels 22 constitutes a source select line.

While the processes for wholly removing the exposed portions of the second dielectric layer 21 and then forming the first and second memory layers 24 and 26 are described in the present embodiment, it is to be noted that the present invention is not limited to such. When the second dielectric layer 21 includes a single layer such as an oxide layer, a charge storage layer such as a nitride layer and a charge blocking layer such as an oxide layer may be formed on the inner walls of the spaces from which the first and second sacrificial layers 16 and 18 are removed while the second dielectric layer 21 is not removed. Otherwise, in the case where the second dielectric layer 21 is formed of the same substance as the first and second memory layers 24 and 26, formation of the first and second memory layers 24 and 26 may be omitted. Accordingly, the conductive substance may be filled in the spaces formed when the first and second sacrificial layers 16 and 18 are removed. Still otherwise, in the case where the second dielectric layer 21 is formed of the same substance as the first and second memory layers 24 and 26, only a charge blocking layer may be additionally formed, regardless of the charge blocking layer, in order to compensate for damage to the outermost charge blocking layer of the second dielectric layer 21, such as the oxide layer, when the first and second sacrificial layers 16 and 18 are removed.

Thereafter, a third dielectric layer 28 is filled in spaces which remain after the first and second memory layers 24 and 26, the word lines 25, and the select lines 27 are formed. That is to say, the spaces corresponding to the first and second slits S1 and S2 and the block slits BS are filled with the third dielectric layer 28. The third dielectric layer 28 may be, for example, an oxide layer.

Thereupon, by implanting impurity ions into the upper ends of the channels 22, drain regions 29A and source regions 29B are formed. Each drain region 29A is formed on the upper end of channel 22 between the pair of channels 22 which is to contact a subsequently formed bit line. Each source region 29B is formed on the upper end of the channel 22 between the pair of channels 22 which is to contact a subsequently formed source line. Impurities may be N-type impurities such as boron.

Figure 10:
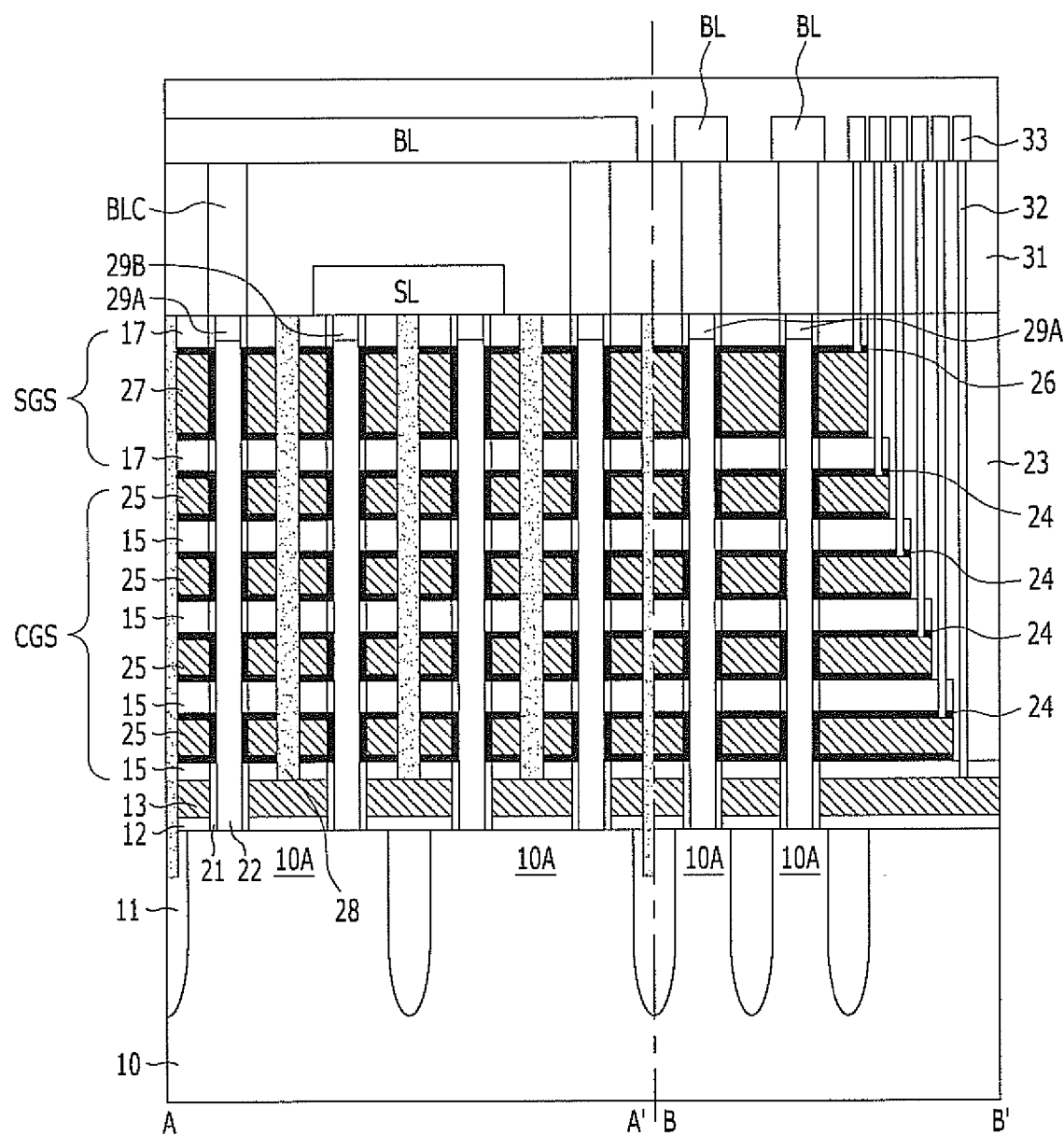

Referring to FIG. 10, by depositing a conductive substance on the resultant structure of FIG. 9 and patterning the conductive substance, a source line SL is formed in such a way as to simultaneously contact channels 22, which belong to different pairs, are adjacent to each other, and extend in the second direction. By using a metal or a metal silicide as the conductive substance, the resistance of the source line SL may be reduced.

Then, a fourth interlayer dielectric layer 31 is formed to cover the source line SL. Bit line contacts BLC are formed through the fourth interlayer dielectric layer 31 to respectively contact the channels 22 which are formed with the drain regions 29A. A plurality of contacts 32 are formed through the fourth interlayer dielectric layer 31 and the third interlayer dielectric layer 23 in such a way as to be respectively connected with the select line 27, the word lines 25 and the bottom gate 13.

Next, bit lines BL, which are connected with the bit line contacts BLC and extend in the first direction, and wiring lines 33, which are respectively connected with the plurality of contacts 32, are formed by depositing and patterning a conductive substance on the fourth interlayer dielectric layer 31. These wiring lines 33 are to respectively control the select line 27, the word lines 25, and the bottom gate 13.

In these ways, the device shown in FIGS. 1 and 2 may be fabricated. However, it is to be noted that a method for fabricating the device shown in FIGS. 1 and 2 is not limited to such and various modifications may be made. For example, a method may be used, in which a conductive layer for word lines and a conductive layer for select lines may be directly deposited instead of the first and second sacrificial layers 16 and 18. This method will be described below with reference to FIGS. 11 to 13, and the same reference numerals will be used to refer to the same component parts as those of the aforementioned embodiment and detailed descriptions of the same component parts will be omitted herein.

Figure 11:
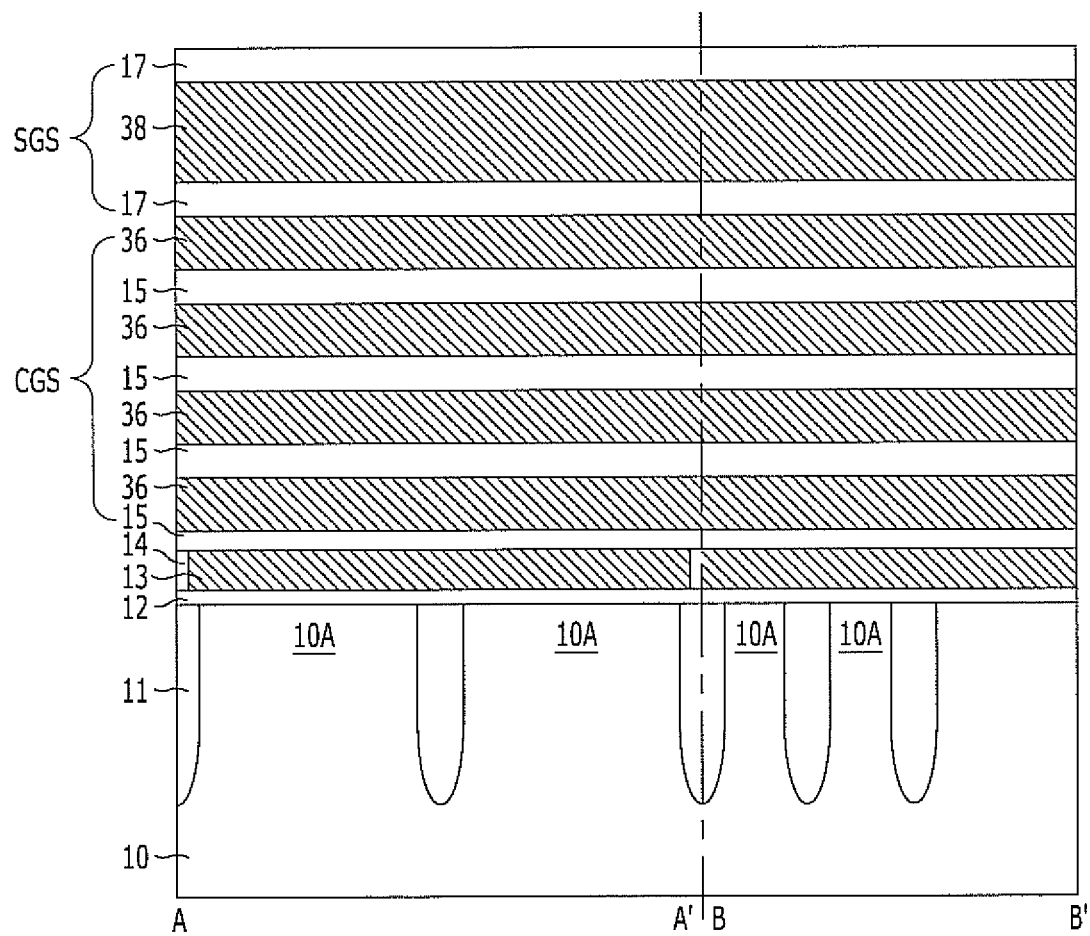
FIGS. 11 to 13 are views explaining another embodiment of the method for fabricating the device shown in FIGS. 1 and 2.
Figure 12:
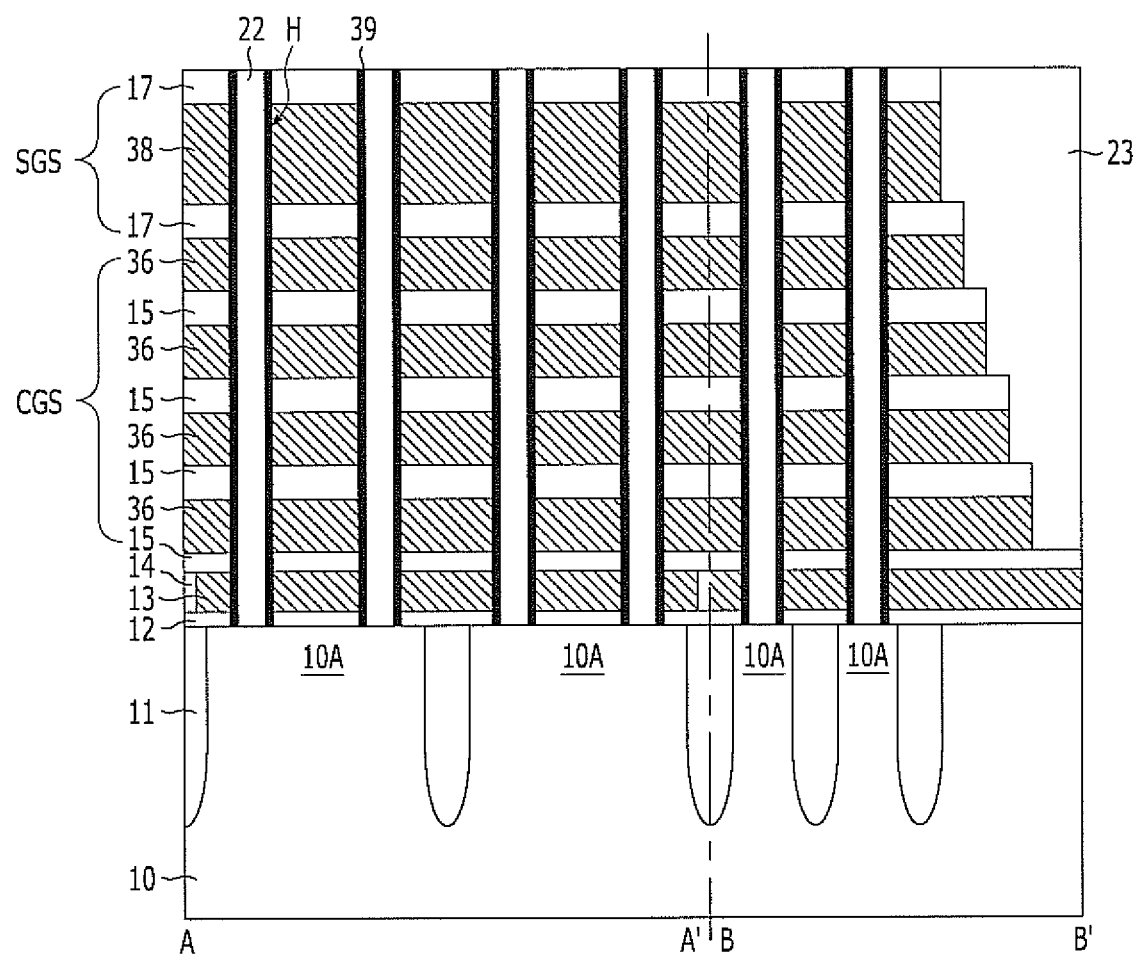
Figure 13:
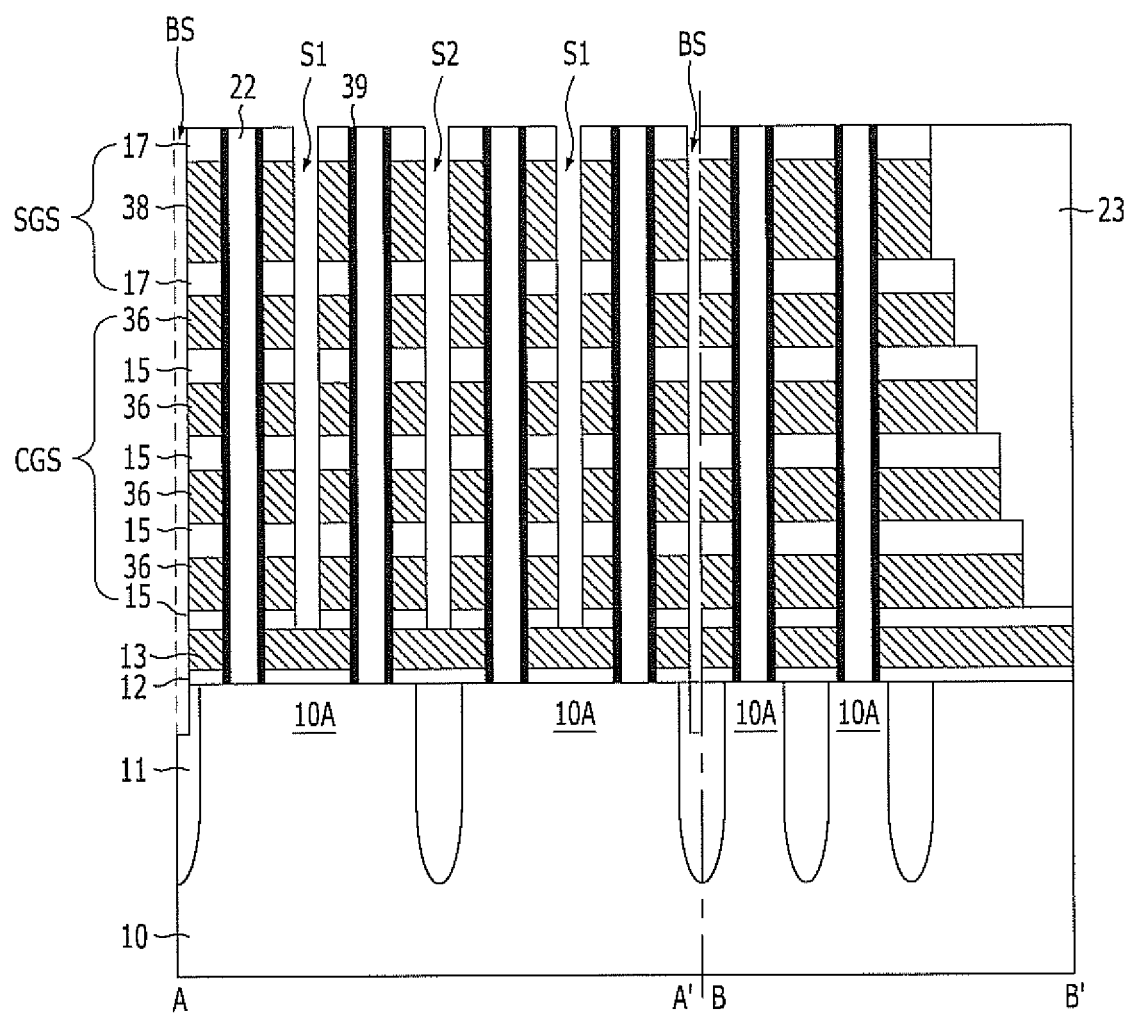

FIGS. 11 to 13 are views explaining another embodiment of the method for fabricating the device shown in FIGS. 1 and 2.

Referring to FIG. 11, after performing the processes of FIGS. 3A to 4B, a cell gate structure CGS, including a plurality of first interlayer dielectric layers 15 and a plurality of conductive layers 36 for word lines alternately stacked each other, is formed on the bottom gate 13 and the first dielectric layer 14. Then, a select gate structure SGS, including a second interlayer dielectric layer 17, a conductive layer 38 for select lines, and another second interlayer dielectric layer 17 sequentially stacked, is formed on the cell gate structure CGS. The conductive layers 36 for word lines and the conductive layer 38 for select lines may be formed using, for example, polysilicon doped with impurities.

Referring to FIG. 12, a pair of channel holes H are defined through the cell gate structure CGS and the select gate structure SGS, the bottom gate 13 and the first gate dielectric layer 12 in such a way as to expose the active region 10A.

Thereupon, after forming a memory layer 39 on the sidewalls of the channel holes H, channels 22 are formed by filling a semiconductor substance in the channel holes H. The memory layer 39 which contacts the conductive layers 36 for word lines performs a charge storage function to serve as a gate dielectric layer. Conversely, the memory layer 39, which contacts the bottom gate 13 and the conductive layer for select lines, serves as a gate dielectric layer.

Next, slimming for forming the peripheral region E of the substrate 10 into step-like shapes is performed.

Referring to FIG. 13, by selectively etching the cell gate structure CGS and the select gate structure SGS, first and second slits S1 and S2 and block slits BS are defined to pass through the cell gate structure CGS and the select gate structure SGS. By defining the first and second slits S1 and S2 and the block slits BS, the conductive layers 36 for word lines constitute word lines which extend in the second direction. The conductive line 38 for select lines constitutes select lines which extend in the second direction.

In succession, while not shown in a drawing, subsequent processes similar to those described above with reference to FIGS. 9 and 10 are performed. In other words, after filling the first and second slits S1 and S1 and the block slits BS with a third dielectric layer 28, a process for forming drain regions 29A and source regions 29B, a process for forming a source line SL, and a process for forming bit lines BL are performed, in order to fabricate the device shown in FIGS. 1 and 2.

While it was explained in the first embodiment described above that the substrate 10 constituted by a P-type semiconductor is provided and the active regions 10A are defined by directly forming trenches in the substrate 10, a separate P-type semiconductor layer may be used in place of the substrate 10 in another embodiment. Hereafter, a nonvolatile memory device in accordance with a second embodiment of the present invention and a method for fabricating the same will be described with reference to FIGS. 14A to 16. FIGS. 14A to 16 are shown on the basis of the same assumptions as FIGS. 3A to 10.

Figure 14A:
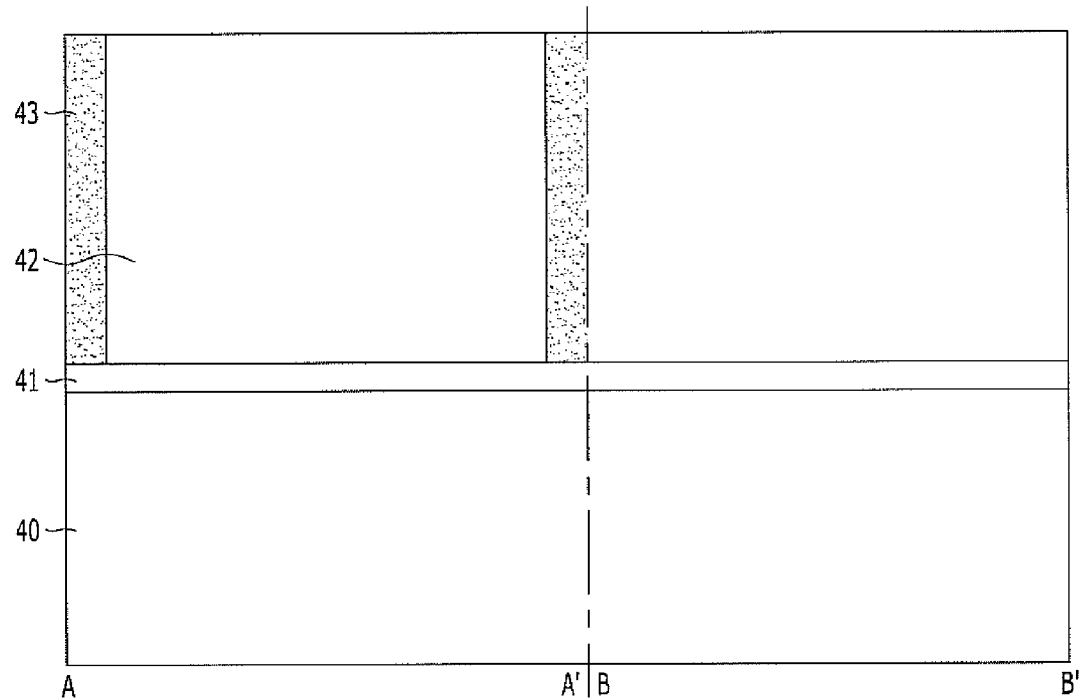
FIGS. 14A to 16 are views explaining a nonvolatile memory device in accordance with a second embodiment of the present invention and a method for fabricating the same.
Figure 14B:
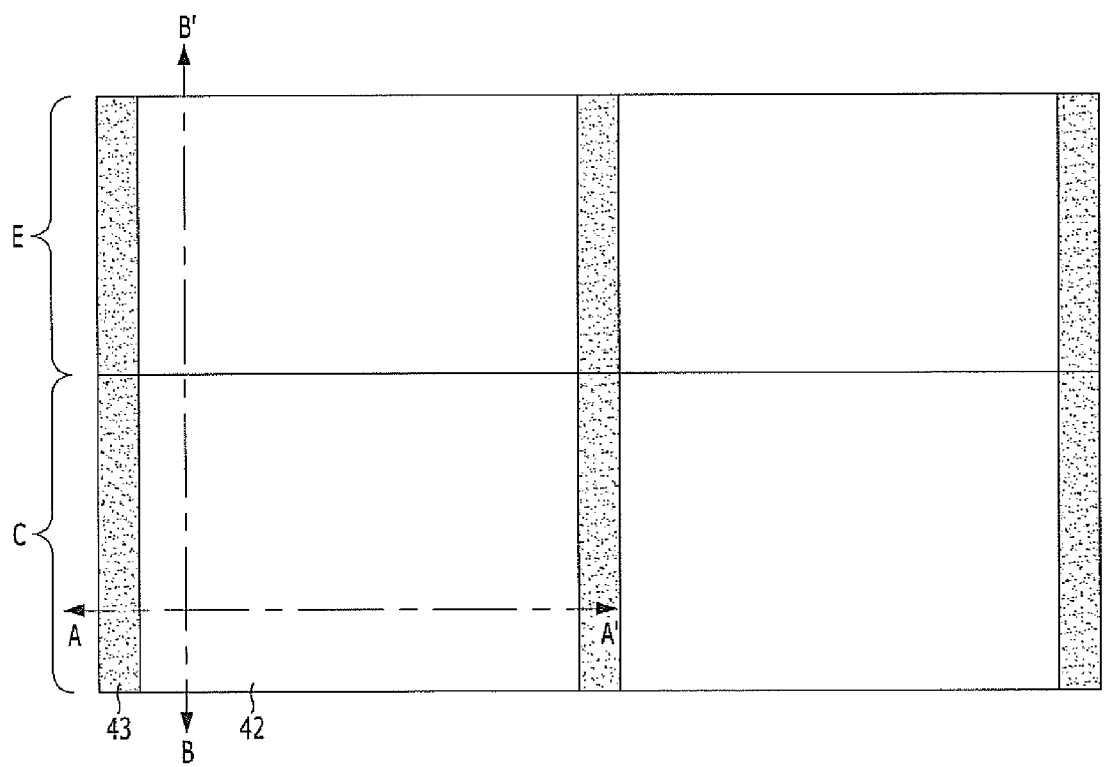

Referring to FIGS. 14A and 14B, a substrate 40 is provided. Unlike the first embodiment, the substrate 40 does not need to be constituted by a P-type semiconductor, and may be formed of any substance.

Then, after forming a first dielectric layer 41 on the substrate 40, a P-type semiconductor layer 42 is formed on the first dielectric layer 41.

Next, after the P-type semiconductor layer 42 is selectively etched and divided for respective blocks, a second dielectric layer 43 is formed in such a way as to fill the spaces from which the P-type semiconductor layer 42 is etched.

Figure 15A:
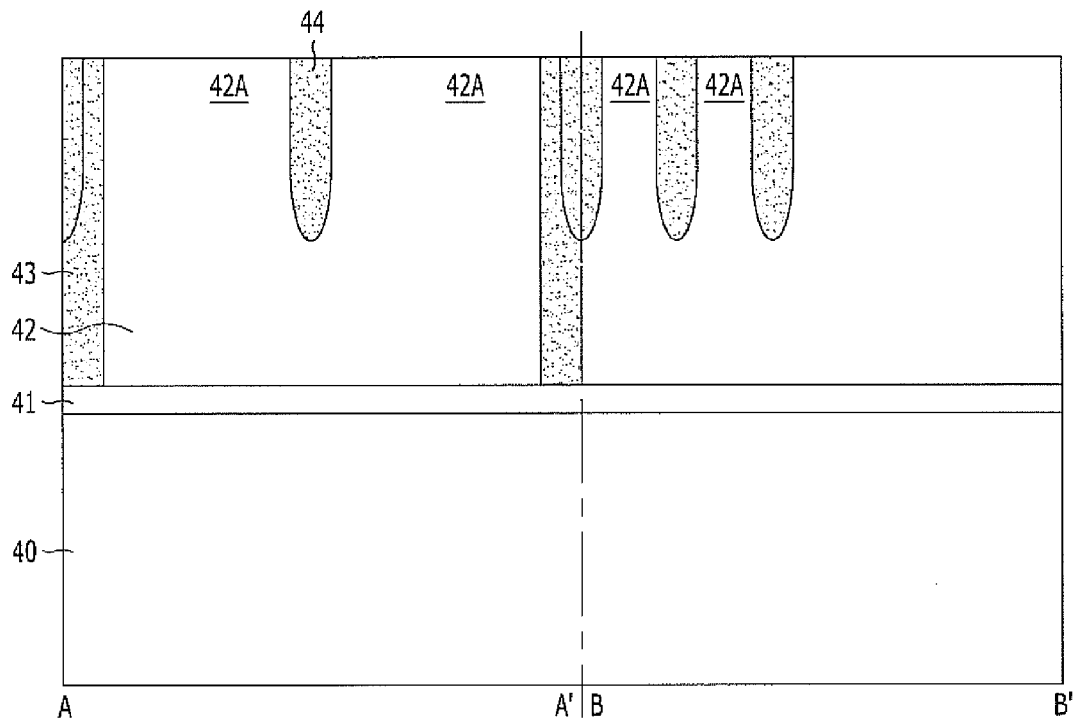
Figure 15B:
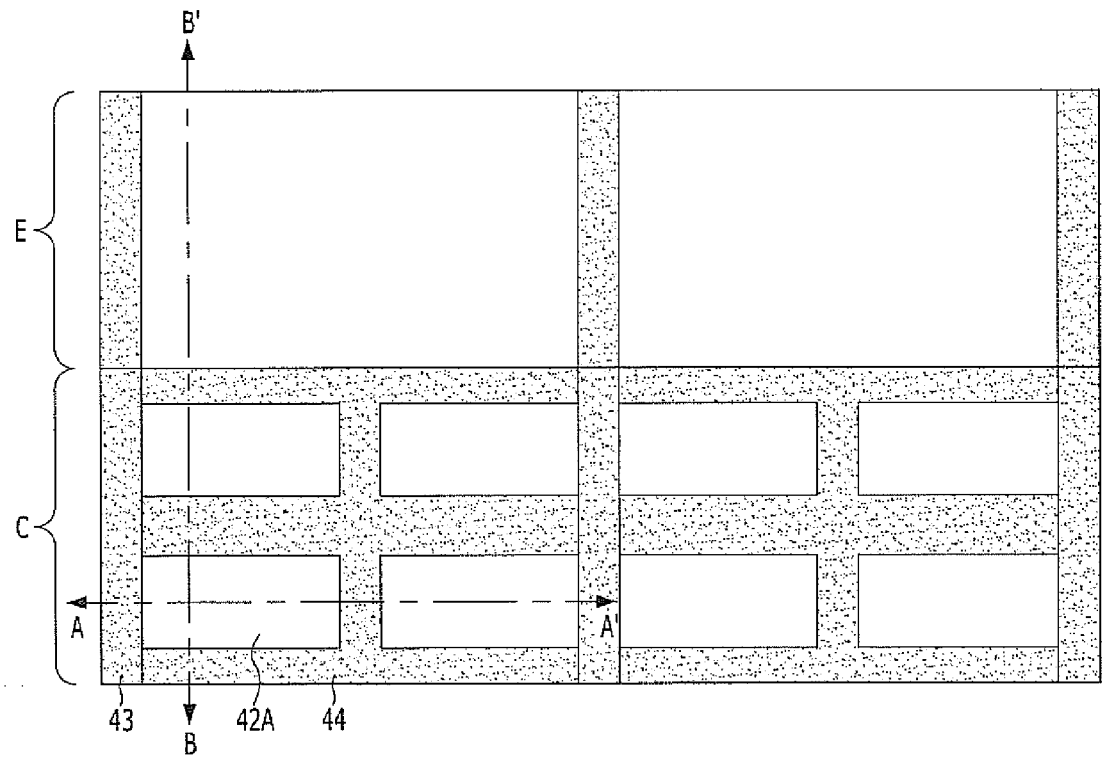

Referring to FIGS. 15A and 15B, after defining trenches for isolation by selectively etching the isolation areas of the central region C of the P-type semiconductor layer 42, an isolation layer 42 is formed by filling the trenches for isolation with a dielectric layer such as an oxide layer or a nitride layer. By the isolation layer 44, active regions 42A are defined in the P-type semiconductor layer 42.

Figure 16:
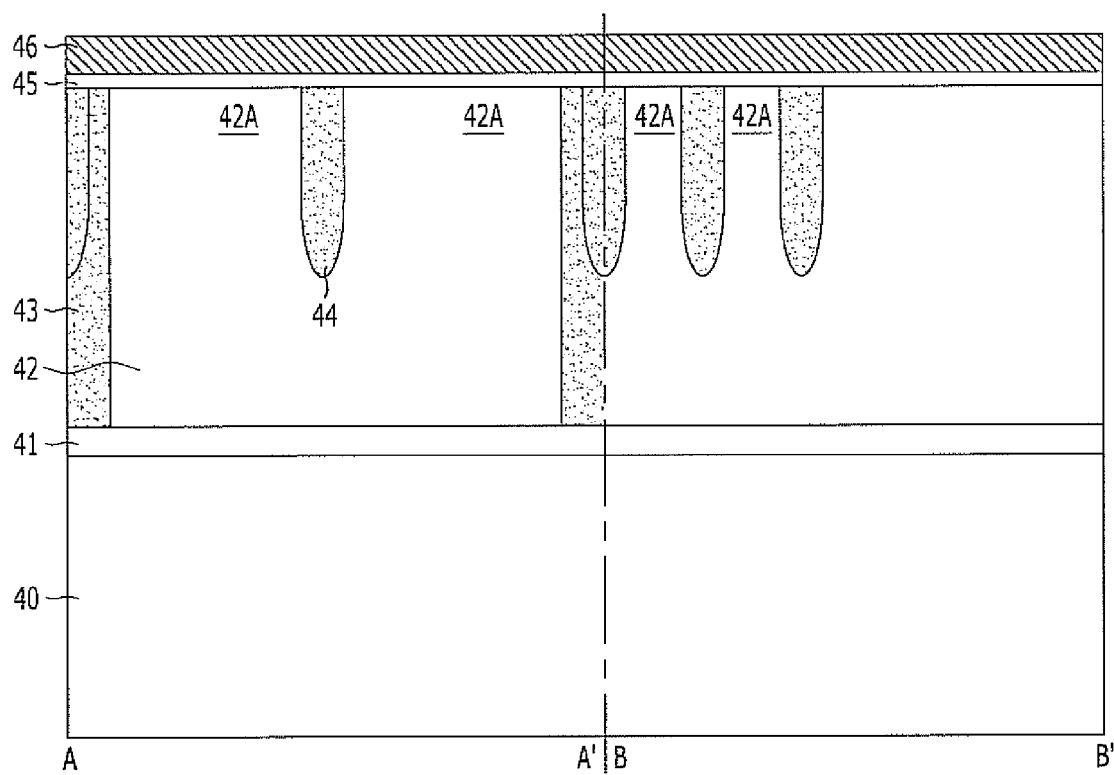

Referring to FIG. 16, after forming a first gate dielectric layer 45 on the resultant processed structure of FIGS. 15A and 15B, a bottom gate 46 is formed by depositing a conductive layer on the first gate dielectric layer 45. In the present embodiment, because the P-type semiconductor layer 42 is divided for respective blocks, the bottom gate 46 need not be divided for respective blocks. However, the P-type semiconductor layer 42 may not be divided for respective blocks. In this case, the bottom gate 46 may be divided for respective blocks.

Subsequent processes are the same as those as described above. For example, the processes described above with reference to FIGS. 5 to 10 or the other processes described above with reference to FIGS. 11 to 13 may be performed.

The device in accordance with the second embodiment fabricated by the above-described processes is substantially the same as the device in accordance with the first embodiment except that a P-type semiconductor layer is used in place of a substrate. Accordingly, since an operating method is substantially the same as that of the first embodiment, explanations thereof will be omitted herein.

In the aforementioned first embodiment, the connection of the vertical strings ST1 and ST2 is controlled in such a manner that the bottom gate BG forms an inverted region in the active region 10A. However, in another embodiment, the bottom gate BG may be omitted and the lowermost word line WL may perform the function of the bottom gate BG. This will be described below with reference to FIGS. 17 to 20.

Figure 17:
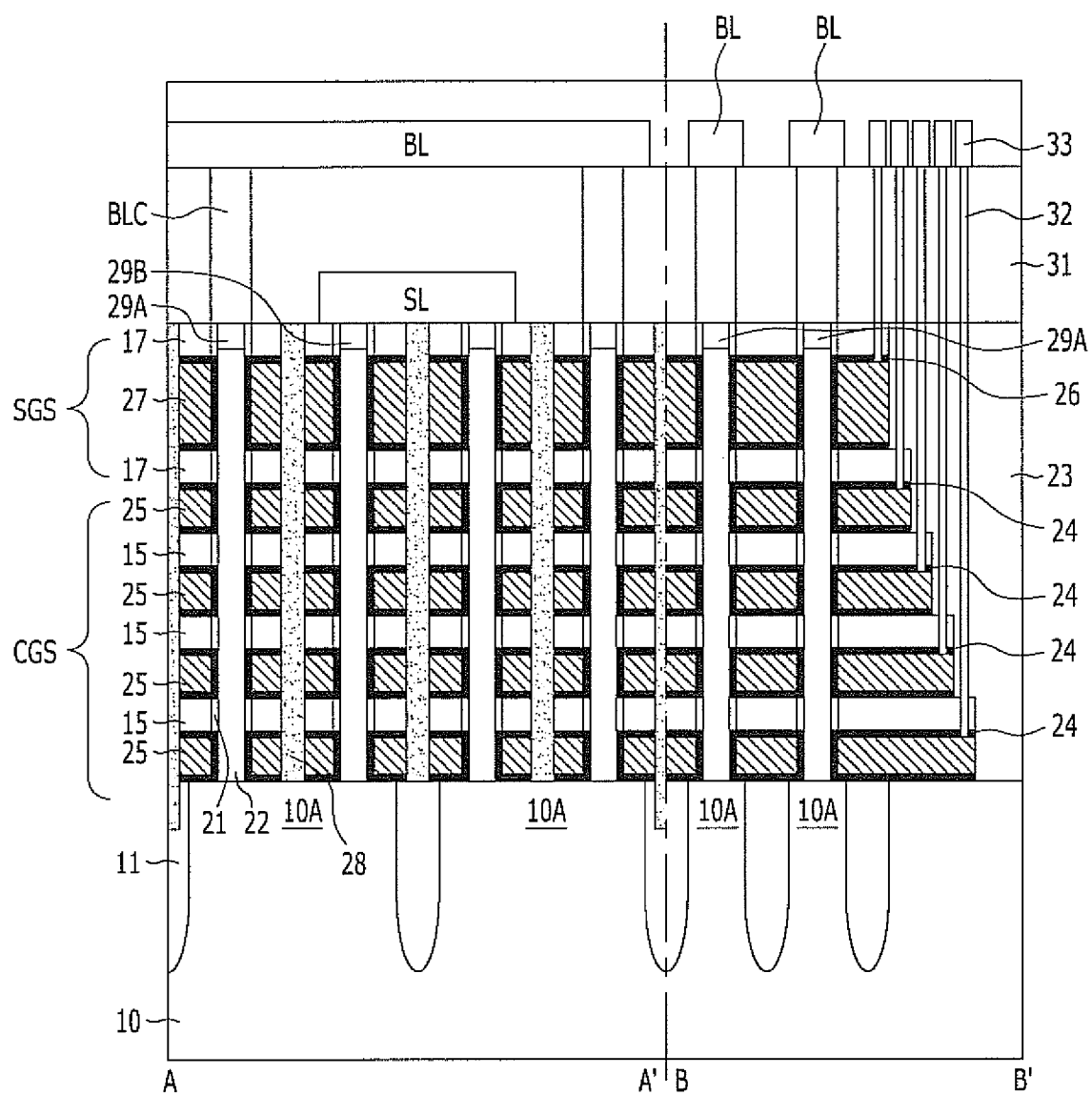
FIGS. 17 and 18 are views explaining a nonvolatile memory device in accordance with a third embodiment of the present invention, a method for fabricating the same and a method for operating the same.
Figure 18:
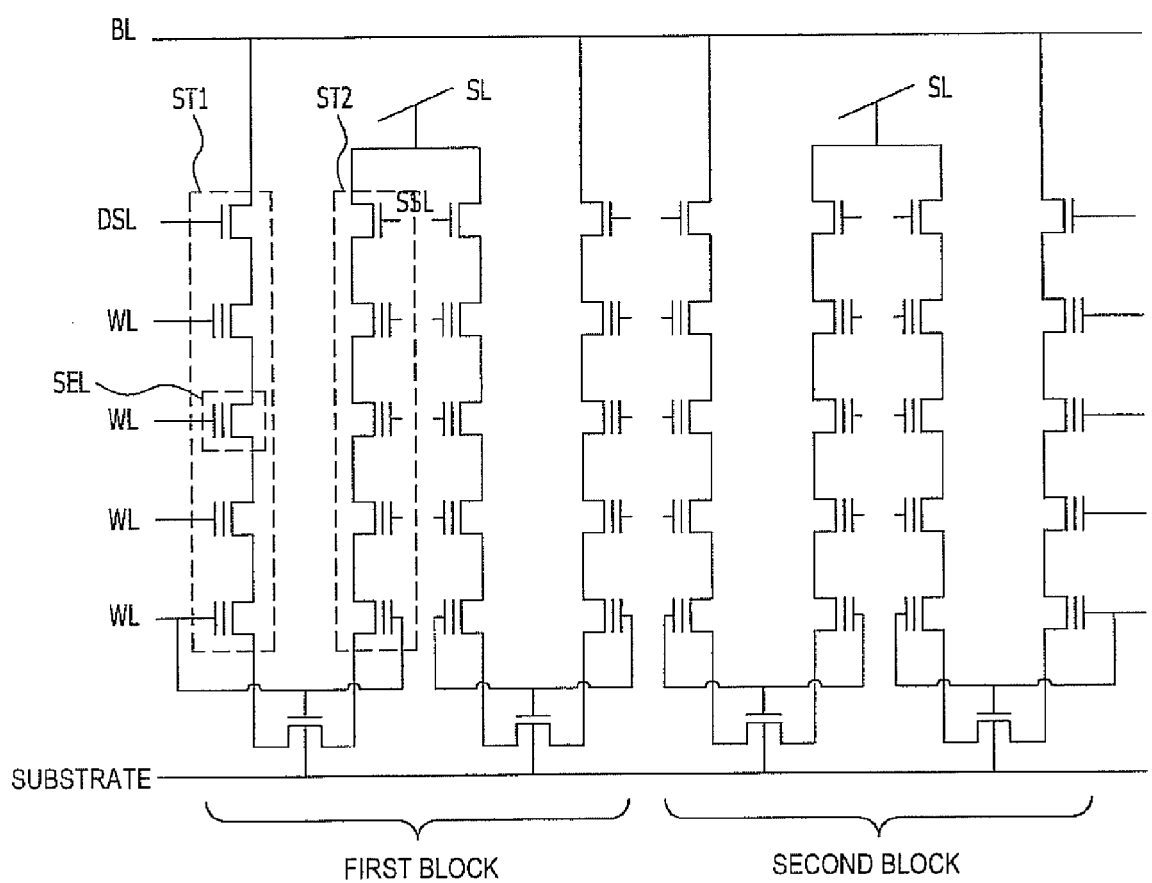

FIGS. 17 and 18 are views explaining a nonvolatile memory device in accordance with a third embodiment of the present invention, a method for fabricating the same and a method for operating the same. FIG. 17 is shown on the basis of the same assumptions as the cross-sectional view of FIG. 10. FIG. 18 is shown on the basis of the same assumptions as FIG. 2.

Referring to FIGS. 17 and 18, the nonvolatile memory device according to the present embodiment includes a substrate 10, which is constituted by a P-type semiconductor and has a plurality of active regions 10A defined by an isolation layer 11, and a pair of vertical strings ST1 and ST2 which are formed on each active region 10A. In particular, connection of vertical strings ST1 and ST2 is controlled in such a manner that a lowermost word line 25 forms an inverted region in the active region 10A. Namely, the device according to this third embodiment has a structure excluding the bottom gate BG, the underlying gate dielectric layer, and the overlying interlayer dielectric layer against the device according to the first embodiment.

Here, a first memory layer 24 interposed between the lowermost word line 25 and the substrate 10 serves as a gate dielectric layer which insulates the word line 25 and the substrate 10 from each other. The first memory layer 24 has a thickness required to form the inverted region.

In the case where a predetermined positive voltage is applied to the lowermost word line 25, an N-type inverted region is formed in the active region 10A which is constituted by a P-type semiconductor. Accordingly, current flow for connecting a channel CH of the first vertical string ST1 and a channel CH of the second vertical string ST2 with each other may be produced in the active region 10A. That is to say, a kind of pass transistor is formed between the first vertical string ST1 and the second vertical string ST2 to control the connection thereof. The gate terminal, the drain terminal, the source terminal, and the substrate terminal of the pass transistor are respectively connected to the lowermost word line 25, the channel CH of the first vertical string ST1, the channel CH of the second vertical string ST2, and the substrate 10.

A method for fabricating the device according to the present embodiment may be implemented without processes of forming the first gate dielectric layer 12, forming the bottom gate 13, and forming the lowermost interlayer dielectric layer 15 against the fabrication processes of FIGS. 3A to 10. Therefore, detailed descriptions thereof will be omitted herein.

A method for operating the device according to the present embodiment is similar to the method described above with reference to the first embodiment except that it is sufficient that the voltage applied to the bottom gate BG is applied to the lowermost word line 25 instead of the bottom gate BG.

Figure 19:
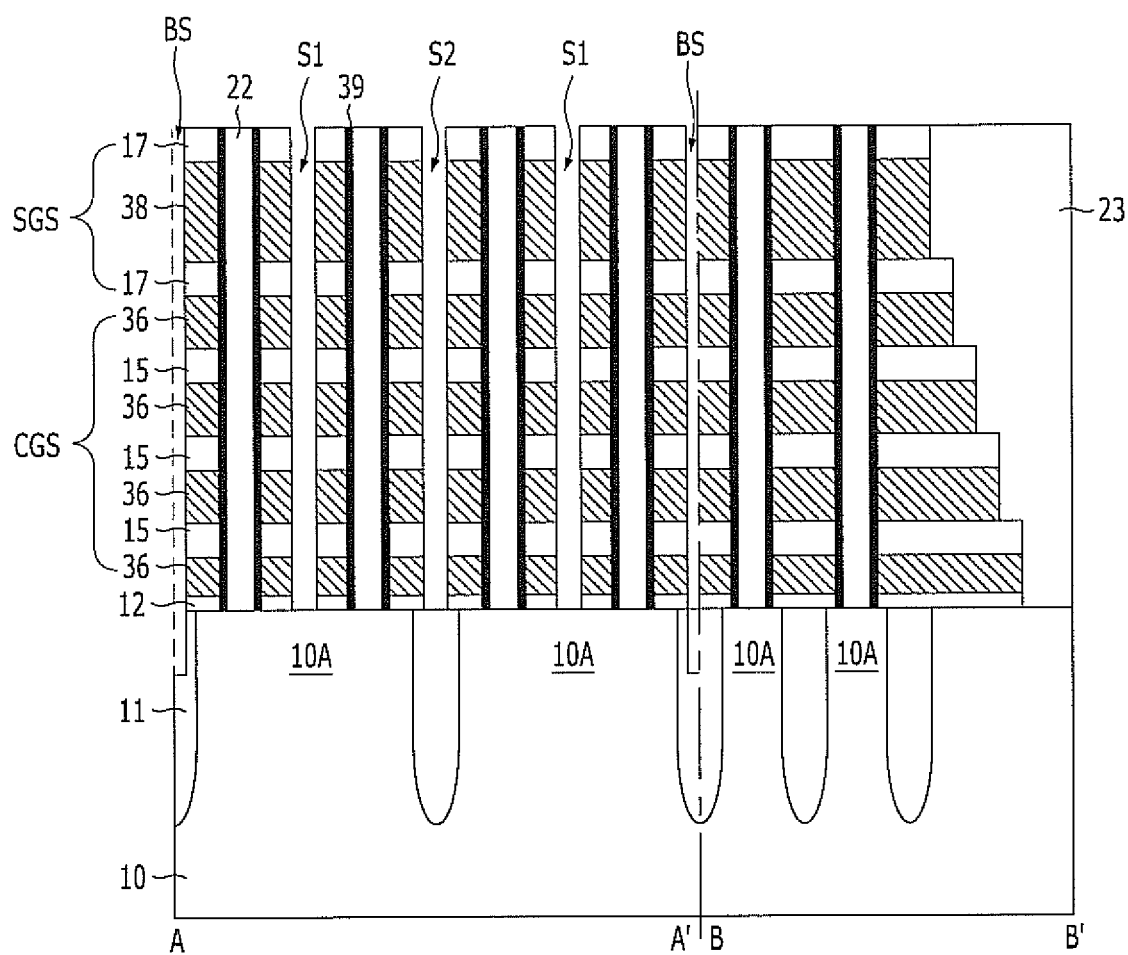
FIG. 19 is a view explaining a nonvolatile memory device in accordance with a fourth embodiment of the present invention, a method for fabricating the same and a method for operating the same.

FIG. 19 is a view explaining a nonvolatile memory device in accordance with a fourth embodiment of the present invention, a method for fabricating the same and a method for operating the same. FIG. 19 is shown on the basis of the same assumptions as FIG. 13. The circuit diagram of the present embodiment is substantially the same as FIG. 18.

Referring to FIG. 19, the nonvolatile memory device according to the present embodiment includes a substrate 10, which is constituted by a P-type semiconductor and has a plurality of active regions 10A defined by an isolation layer 11, and a pair of vertical strings ST1 and ST2 which are formed on each active region 10A. In particular, the connection of vertical strings ST1 and ST2 is controlled in such a manner that a lowermost word line 36 forms an inverted region in the active region 10A.

In other words, the device according to the fourth embodiment has a structure in which the bottom gate BG and the overlying interlayer dielectric layer are omitted from the device according to the first embodiment. Unlike the third embodiment, since a memory layer 39 is not interposed between the lowermost word line 36 and the substrate 10, a first gate dielectric layer 12 with a thickness appropriate for the formation of the inverted region should be interposed between the lowermost word line 36 and the substrate 10 to insulate them from each other.

A method for fabricating the device according to the present embodiment may be implemented without processes of forming the bottom gate 13 and forming the lowermost interlayer dielectric layer 15 against the fabrication processes of FIGS. 11 to 13. Therefore, detailed descriptions thereof will be omitted herein.

A method for operating the device according to the present embodiment is the same as that described above with reference to the third embodiment.

Figure 20:
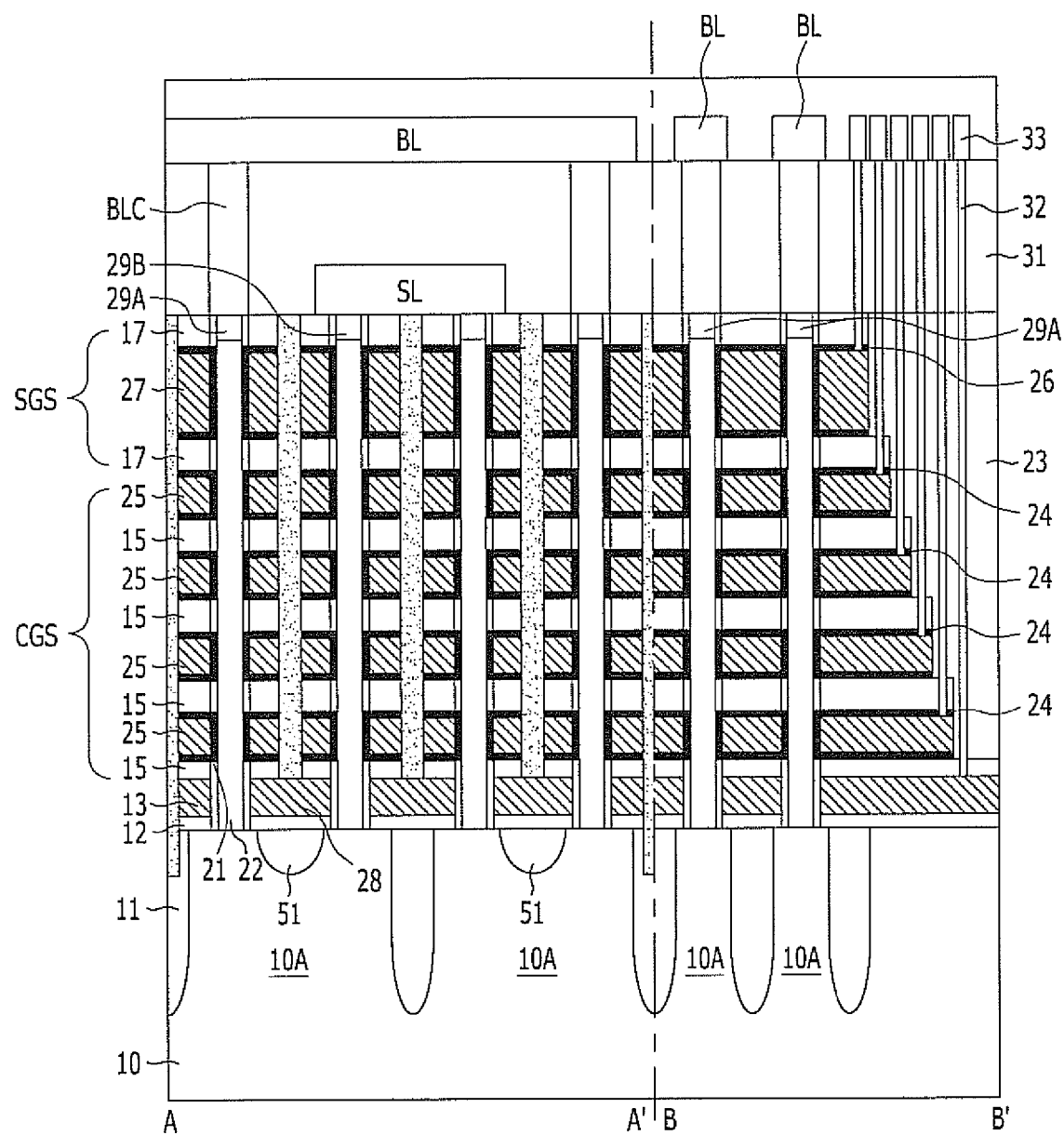
FIG. 20 is a view explaining a nonvolatile memory device in accordance with a fifth embodiment of the present invention, a method for fabricating the same and a method for operating the same.

FIG. 20 is a view explaining a nonvolatile memory device in accordance with a fifth embodiment of the present invention, a method for fabricating the same and a method for operating the same.

Referring to FIG. 20, the nonvolatile memory device according to the present embodiment is substantially the same as the device according to the first embodiment and is characterized in that it includes an N-type impurity region 51 which is formed by doping N-type impurities in an active region 10A between a pair of channels 22.

The doping process of the N-type impurities may be performed between the action of forming active regions 10A and the action of forming a bottom gate 13.

In the case where the N-type impurity region 51 is additionally formed in this way, the connection of a pair of vertical strings ST1 and ST2 may be easily implemented. In the present embodiment, the vertical strings ST1 and ST2 are connected with each other basically by the formation of an inverted region. The N-type impurity region 51 may serve to complement the connection of the vertical strings ST1 and ST2.

Figure 21:
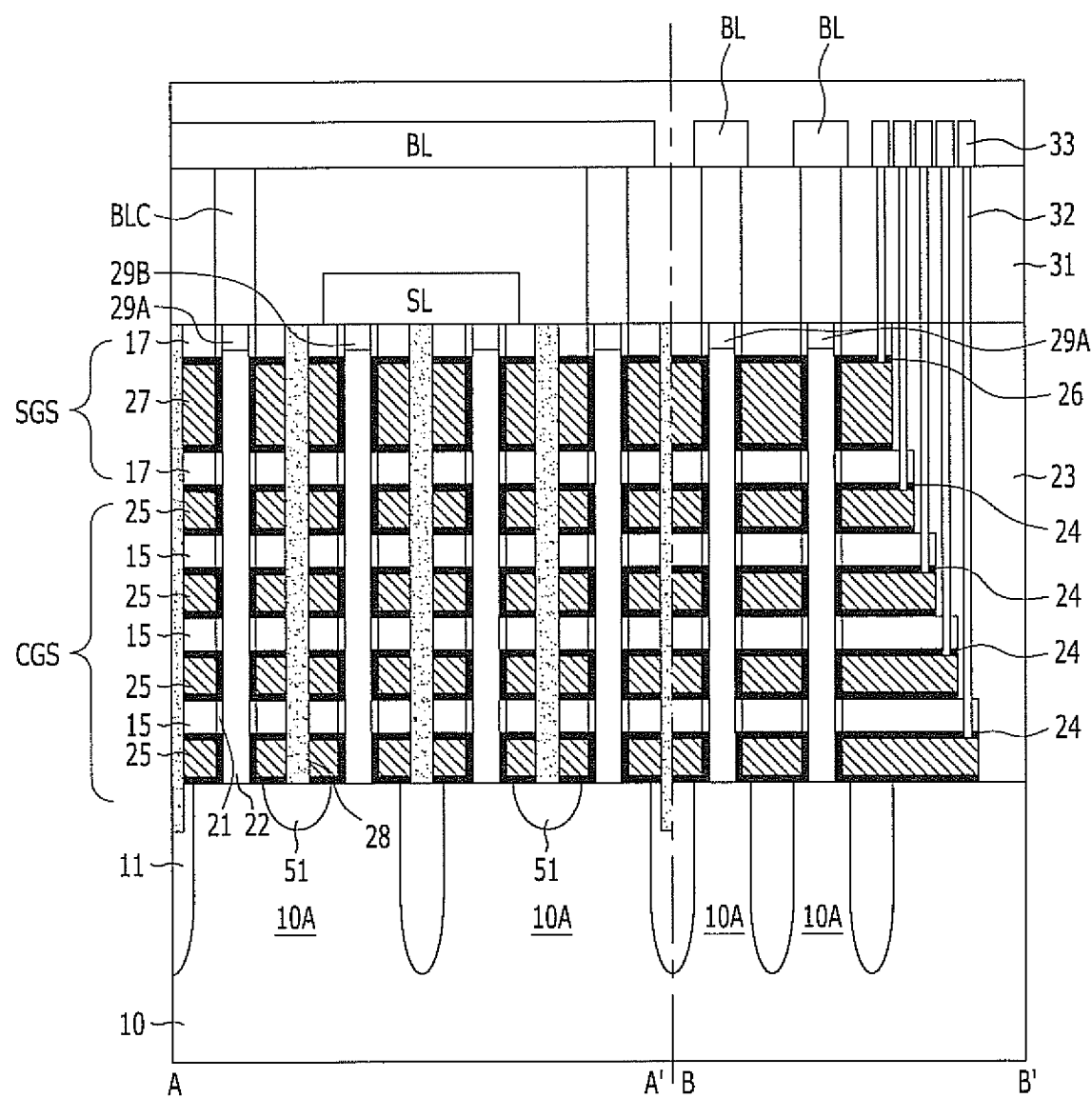
FIG. 21 is a view explaining a nonvolatile memory device in accordance with a sixth embodiment of the present invention, a method for fabricating the same and a method for operating the same.

FIG. 21 is a view explaining a nonvolatile memory device in accordance with a sixth embodiment of the present invention, a method for fabricating the same and a method for operating the same.

Referring to FIG. 21, the nonvolatile memory device according to the present embodiment is similar to the device according to the third embodiment. However, the nonvolatile memory device includes an N-type impurity region 51 which is formed by doping N-type impurities in an active region 10A between a pair of channels 22.

The doping process of the N-type impurities may be performed between the action of forming active regions 10A and the action of depositing sacrificial layers (not shown) for the formation of word lines 25. Otherwise, the doping process of the N-type impurities may be performed into the active regions 10A which are exposed through slits (not shown) before filling a dielectric layer 28 in the slits.

In the case where the N-type impurity region 51 is additionally formed in this way, the connection of vertical strings ST1 and ST2 may be easily implemented. In the present embodiment, the vertical strings ST1 and ST2 are connected with each other basically by the formation of an inverted region. The N-type impurity region 51 may serve to complement the connection of the pair of vertical strings ST1 and ST2.

In the aforementioned fifth and sixth embodiments, the N-type impurity region 51 performs a different function from the source line which is formed in the TCAT structure. In the TACT structure, because the source line is formed in the source line through performing an ion implantation process through narrow slits, a problem is caused in that the resistance of the source line increases. However, in these embodiments, since the N-type impurity region 51 is not for the formation of a source line but performs the function of complementing the connection of the vertical strings ST1 and ST2, no problem is caused even when the width of the N-type impurity region 51 decreases. Furthermore, no problem is caused even when the N-type impurity region 51 is influenced by a subsequent annealing process, and etc.

Moreover, in the aforementioned fifth and sixth embodiments, the N-type impurity region 51 may independently connect the vertical strings ST1 and ST2. In this case, the formation of a bottom gate is not required, and it is not necessary for a lowermost word line to form an inverted region. If the N-type impurity region 51 independently connects the vertical strings ST1 and ST2, the width of the N-type impurity region 51 should be appropriately controlled. For example, the N-type impurity region 51 may have a relatively wide width to overlap with an entire region corresponding to the width between one and the other in a pair of channels 22. Furthermore, the N-type impurity region 51 may partially overlap with the channels 22. Since an erase voltage may be applied to the substrate 10, an erase operation may be easily performed as in the aforementioned embodiment.

While the device according to the first embodiment is shown for a cell region, it is to be noted that a peripheral region is included. In the method for fabricating the device according to the first embodiment, the isolation layer 11 may be formed in the peripheral region at the same time as the action of forming the isolation layer 11. The gate of the transistor of the peripheral region may be formed at the same time as the action of forming the bottom gate 13. This will be described with reference to FIG. 22.

Figure 22:
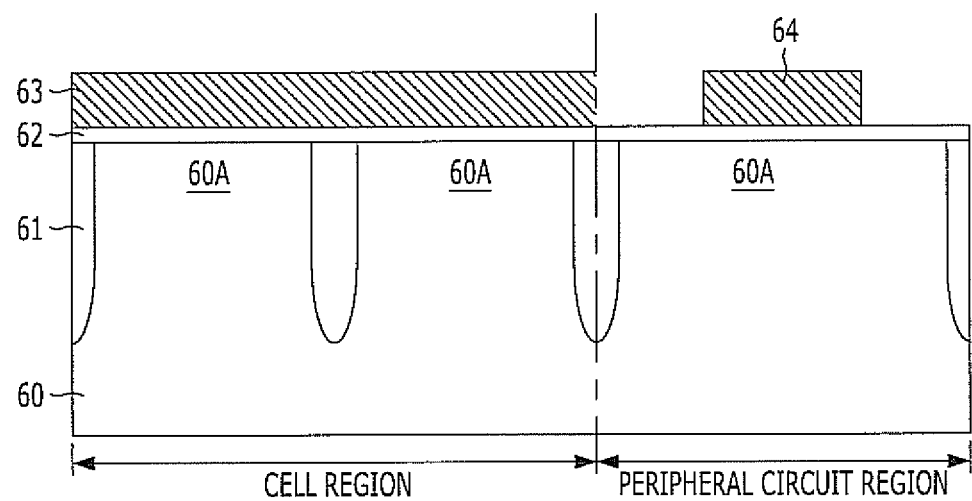
FIG. 22 is a view explaining a nonvolatile memory device in accordance with a seventh embodiment of the present invention and a method for fabricating the same.

FIG. 22 is a view explaining a nonvolatile memory device in accordance with a seventh embodiment of the present invention and a method for fabricating the same.

Referring to FIG. 22, after providing a substrate 60 where a cell region and a peripheral circuit region are defined but constituted by a P-type semiconductor, trenches for isolation are defined by selectively etching isolation areas of the cell region and the peripheral region. Then, an isolation layer 61 is formed by filling the trenches for isolation with a dielectric layer such as an oxide layer or a nitride layer. According to the formation of the isolation layer 61, active regions 60A are defined in the cell region and the peripheral region.

Then, a gate dielectric layer 62 is formed on the substrate 60 including the isolation layer 61.

Next, a conductive layer is deposited and patterned on the gate dielectric layer 62 so as to form a bottom gate 63 in the cell region and a gate 64 of a peripheral circuit transistor in the peripheral region. Thereafter, the above-described subsequent processes are performed.

As is apparent from the above descriptions, the nonvolatile memory device and the method for fabricating the same according to the embodiments of the present invention provide advantages in that an erase operation may be easily and efficiently performed while increasing the degree of integration by vertically stacking memory cells and the resistance of a source line may be reduced.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
    a substrate including a plurality of active regions which are constituted by a P-type semiconductor;
    first and second vertical strings disposed over each active region, wherein each of the first and second strings includes a channel vertically extending from the substrate, a plurality of memory cells, and a select transistor, wherein the plurality of memory cells and the select transistor are located along the channel;
    a bottom gate being interposed between a lowermost memory cell and the substrate, contacting the channel with a first gate dielectric layer interposed therebetween, and controlling connection of the first vertical string with the second vertical string;
    a bit line connected to an upper end of the channel of the first vertical string; and
    a source line connected to an upper end of the channel of the second vertical string.

2. The nonvolatile memory device of claim 1, wherein the bottom gate connects the first vertical string and the second vertical string with each other in such a way as to form an inverted region in the active region.

3. The nonvolatile memory device of claim 2, further comprising: a second gate dielectric layer interposed between the bottom gate and the active region and having a thickness necessary for formation of the inverted region.

4. The nonvolatile memory device of claim 1, wherein the substrate is constituted by a P-type semiconductor, and the active regions are defined in the substrate by trenches which are formed in the substrate.

5. The nonvolatile memory device of claim 1, wherein the substrate includes a substrate portion and a P-type semiconductor portion insulated from the substrate portion and formed over the substrate portion,
    wherein the active regions are defined in the P-type semiconductor portion by trenches which are formed in the P-type semiconductor portion.

6. The nonvolatile memory device of claim 5, wherein at least one of the P-type semiconductor portion and the bottom gate has the shape of a plate which is divided for respective blocks.

7. The nonvolatile memory device of claim 1, wherein the bottom gate has the shape of a plate which is divided for respective blocks.

8. The nonvolatile memory device of claim 1, further comprising: an N-type impurity region formed in the active region to be disposed between the channel of the first vertical string and the channel of the second vertical string.

9. The nonvolatile memory device of claim 1, wherein the substrate includes a peripheral circuit region where the first and second vertical strings are not disposed, and wherein the nonvolatile memory device further comprises: a peripheral circuit gate disposed over an active region of the peripheral circuit region, placed on the same layer as the bottom gate, and formed of the same substance as the bottom gate.

10. A method for operating the nonvolatile memory device of claim 1, comprising:
    applying a pass voltage to a bottom gate in a read operation or a program operation to form an inverted region in an active region, thereby connecting a first vertical string and a second vertical string with each other; and
    applying an erase voltage to the active region in an erase operation.

11. A nonvolatile memory device comprising:
    a substrate including a plurality of active regions which are constituted by a P-type semiconductor;
    first and second vertical strings disposed over each active region, wherein each of the first and second strings includes a channel vertically extending from the substrate, a plurality of memory cells, and a select transistor, wherein the plurality of memory cells and the select transistor are located along the channel; and
    an N-type impurity region fowled in the active region to be disposed between the channel of the first vertical string and the channel of the second vertical string, and connecting the first vertical string with the second vertical string.

12. The nonvolatile memory device of claim 11, wherein the N-type impurity region overlaps with a portion of the channel of the first vertical string and a portion of the channel of the second vertical string.

13. A method for operating the nonvolatile memory device of claim 11, comprising:
    applying an erase voltage to the active region in an erase operation.

* * * * *